(12) United States Patent
Camirand Lemyre et al.

(10) Patent No.: US 12,375,085 B2
(45) Date of Patent: Jul. 29, 2025

(54) QUANTUM DEVICE AND METHOD OF OPERATING SAME

(71) Applicant: Nord Quantique inc., Sherbrooke (CA)

(72) Inventors: Julien Camirand Lemyre, Sherbrooke (CA); Pascal Lemieux, Sherbrooke (CA)

(73) Assignee: Nord Quantique Inc., Sherbrooke (CA)

( * ) Notice: Subject to any disclaimer, the term of this patent is extended or adjusted under 35 U.S.C. 154(b) by 382 days.

(21) Appl. No.: 18/054,704

(22) Filed: Nov. 11, 2022

(65) Prior Publication Data

US 2023/0155594 A1 May 18, 2023

Related U.S. Application Data

(60) Provisional application No. 63/279,333, filed on Nov. 15, 2021, provisional application No. 63/279,347, filed on Nov. 15, 2021.

(51) Int. Cl.
*H03K 19/195* (2006.01)
*G06N 10/20* (2022.01)
(Continued)

(52) U.S. Cl.
CPC ........... *H03K 19/195* (2013.01); *G06N 10/20* (2022.01); *H10N 60/00* (2023.02); *H10N 60/0912* (2023.02); *H10N 60/12* (2023.02)

(58) Field of Classification Search
CPC ...... H03K 19/195; G06N 10/20; G06N 20/20; G06N 10/40; H10N 60/0912; H10N 69/00; H10N 60/12; B82Y 10/00
(Continued)

(56) References Cited

U.S. PATENT DOCUMENTS

2003/0207766 A1 11/2003 Esteve et al.
2016/0292587 A1 10/2016 Rigetti et al.
(Continued)

OTHER PUBLICATIONS

Dambrot, Stuart M. "Quantum meets classical: Qubit fabricated with integrated micromagnet increases speed of quantum manipulation in silicon", Phys.org, featured article, pp. 1-7, Aug. 25, 2014 (Aug. 25, 2014), retrieved from https://phys.org/news/2014-08-quantum-classical-qubit-fabricated-micromagnet.html on Feb. 17, 2023 (Feb. 17, 2023).
(Continued)

*Primary Examiner* — Arnold M Kinkead
(74) *Attorney, Agent, or Firm* — Stratford Group Ltd.

(57) ABSTRACT

Described are various embodiments of a quantum device and method operating the same. In one embodiment, the quantum device comprises a substrate; a superconducting circuit element supported on a substrate surface of said substrate, the superconducting circuit element exhibiting superconductivity during operation of the quantum device; and a passive magnetic element, the passive magnetic element generating a magnetic field, the superconducting circuit element being directly or indirectly exposed to at least a portion of the magnetic field during operation of the quantum device. In some embodiments, the superconducting circuit element is indirectly exposed to the portion of the magnetic field, the portion of the magnetic field being guided, at least in part, from a first location proximate the passive magnetic element to a second location proximate the superconducting circuit element by one or more magnetic field guides.

12 Claims, 25 Drawing Sheets

(51) Int. Cl.
*H10N 60/00* (2023.01)
*H10N 60/01* (2023.01)
*H10N 60/12* (2023.01)

(58) Field of Classification Search
USPC ................................ 326/3; 365/160, 162
See application file for complete search history.

(56) References Cited

U.S. PATENT DOCUMENTS

| | | |
|---|---|---|
| 2020/0144690 A1 | 5/2020 | Gumann et al. |
| 2020/0167683 A1 | 5/2020 | Frisch et al. |
| 2021/0305480 A1* | 9/2021 | Holmes ................ H10N 60/805 |

OTHER PUBLICATIONS

International Search Report from corresponding PCT application No. PCT/CA2022/051671.

Navau, C., Prat-Camps, J., Romero-Isart, O., Cirac, J. I. and Sanchez, A., "Long-Distance Transfer and Routing of Static Magnetic Fields", Phys. Rev. Lett., pp. 253901, vol. 112, issue 25, 2014, American Physical Society, DOI 10.1103/PhysRevLett.112.253901.

O. Gargiulo, S. Oleschko, J. Prat-Camps, M. Zanner, and G. Kirchmair, "Fast flux control of 3D transmon qubits using a magnetic hose", Appl. Phys. Lett. 118, 012601 (2021) https://doi.org/10.1063/5.0032615.

N. E. Frattini, U. Vool, S. Shankar, A. Narla, K. M. Sliwa, and M. H. Devoret, "3-wave mixing Josephson dipole element", Appl. Phys. Lett. 110, 222603 (2017) https://doi.org/10.1063/1.4984142.

Grimm, A., Frattini, N.E., Puri, S. et al., "Stabilization and operation of a Kerr-cat qubit", Nature 584, 205-209 (2020). https://doi.org/10.1038/s41586-020-2587-z.

Google Quantum AI. "Exponential suppression of bit or phase errors with cyclic error correction". Nature 595, 383-387 (2021). https://doi.org/10.1038/s41586-021-03588-y.

A. Yu. Dmitriev and O. V. Astafiev, "A perspective on superconducting flux qubits", Appl. Phys. Lett. 119, 080501 (2021) https://doi.org/10.1063/5.0047690.

P. Krantz, M. Kjaergaard, F. Yan, T. P. Orlando, S. Gustavsson, and W. D. Oliver, "A quantum engineer's guide to superconducting qubits", Applied Physics Reviews 6, 021318 (2019) https://doi.org/10.1063/1.5089550.

Alexandre Blais, Arne L. Grimsmo, S. M. Girvin, and Andreas Wallraff, "Circuit quantum electrodynamics", Rev. Mod. Phys. 93, 025005—Published May 19, 2021.

N. E. Frattini et al., "Optimizing the nonlinearity and dissipation of a SNAIL Parametric Amplifier for dynamic range", Phys. Rev. Applied 10, 054020(2018) https://doi.org/10.48550/arXiv.1806.06093.

\* cited by examiner

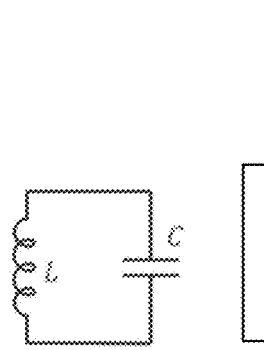
FIG. 1A
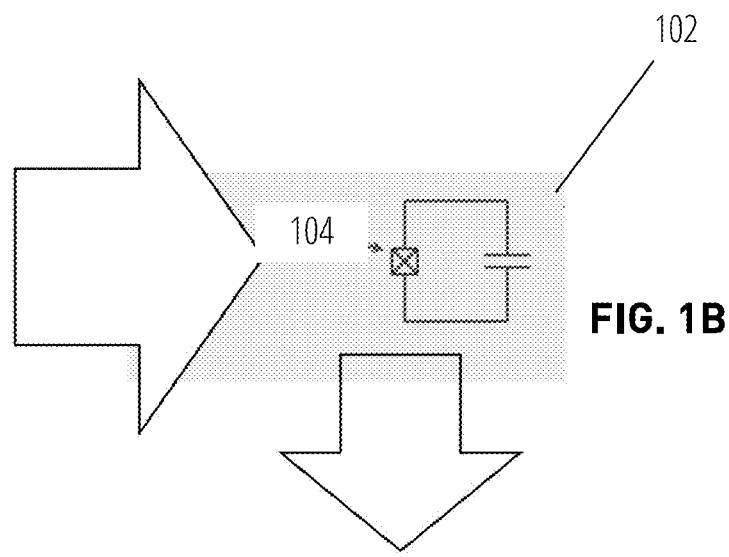
FIG. 1B
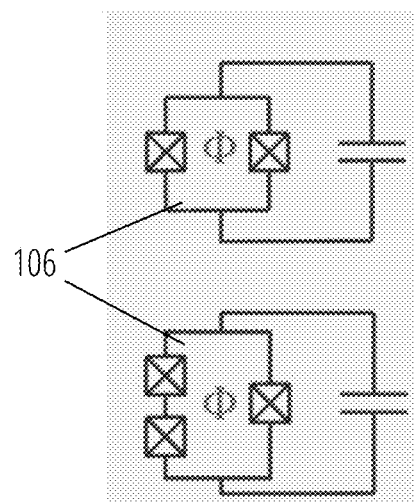
FIG. 1C
FIG. 1D

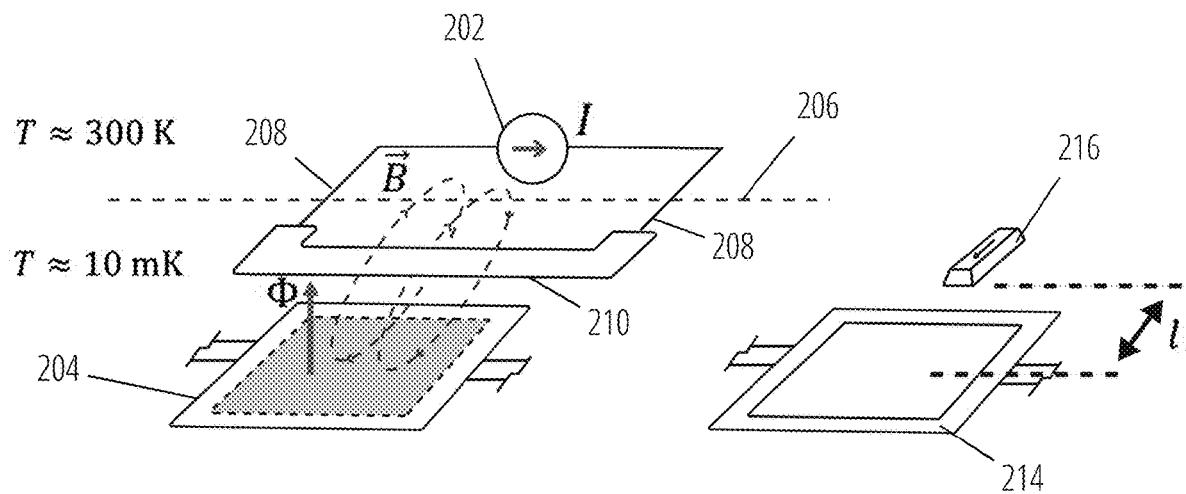
FIG. 2A
FIG. 2C
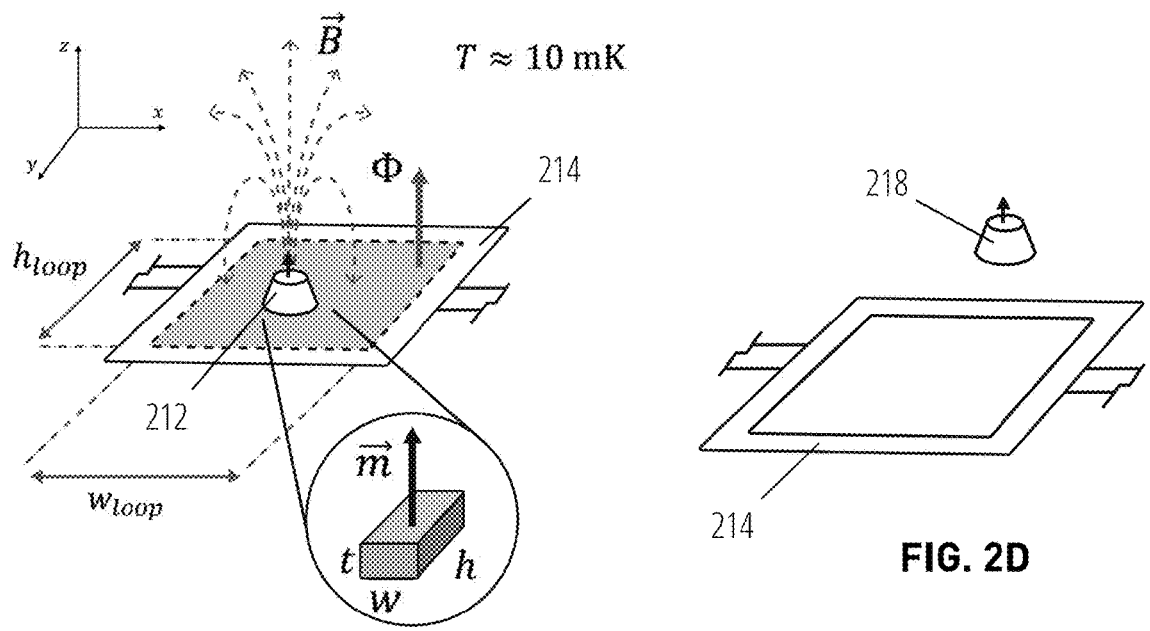
FIG. 2B
FIG. 2D

QUANTUM DEVICE AND METHOD OF OPERATING SAME

CROSS-REFERENCE TO RELATED APPLICATIONS

This application claims the benefit of U.S. Provisional Patent Application No. 63/279,333, filed on Nov. 15, 2021, and U.S. Provisional Patent Application No. 63/279,347, filed on Nov. 15, 2021, each of which are incorporated herein by reference in their entirety.

FIELD OF THE DISCLOSURE

The present disclosure relates to quantum computing, and in particular, to a quantum device and method of operating same.

BACKGROUND

Since their discovery many decades ago, scientists and engineers have been developing devices and systems which harness the properties of quantum physics in various ways. More recently, the field of quantum computing, in particular, has become a particularly active research area because of the possibility to disrupt modern computation, communication and cryptography. Various architectures are considered either practically or theoretically to harness quantum properties, and superconducting circuits, in particular, is one form of an architecture framework which has emerged as being particularly promising.

To make a contrast with classical computers, where information is stored physically in memory, retrieved, transmitted, and processed in binary form (bit), in a quantum computer, information, referred to in this context as quantum information, is stored physically in a memory by encoding it in the state of a quantum subsystem (qubit), processed by quantum algorithms, and measured (retrieved) based on Von Neumann entropy.

One of the main challenges faced in encoding quantum information in actual physical devices is balancing two contradicting requirements. Firstly, by nature, quantum information is fragile and is subject to losses by sources of decoherence. Unfortunately, virtually all interactions with the environment, including desired ("control") interactions, are potential sources of decoherence. Hence, a system designed to store and process quantum information should be isolated as much as possible from interactions with the environment. Secondly, for quantum information to be useful, one needs to be able to process it and ultimately access it, meaning that it needs to be controllable through interactions with an external control system, and for high fidelity control, these controlling interactions are typically performed at a high speed.

Accordingly, it will be understood that while superconducting circuits, and circuits designed in the circuit quantum electrodynamic framework (COED), have emerged as promising architectures for various quantum devices, such as quantum computers for instance, there remained a significant amount of room for improvement. In particular, some superconducting circuit elements referred to as transmons are useful as they can provide desired non-linearity while preserving a certain level of noise resilience. Other superconducting circuit elements, such as superconducting quantum interference devices (SQUIDs), superconducting flux qubits, superconducting nonlinear asymmetric inductive elements (SNAILs) or capacitively shunted SNAILs (SNAILMON), are "flux tunable" in the sense that they can benefit from, or even require a constant magnetic flux during operation. SQUIDs and SNAILs for instance have a superconducting loop having a plurality of Josephson junctions and offer a frequency response which depends on the magnetic flux across the loop. Other parameters such as third and fourth order non-linearities, or the interaction between qubits, can be tuned by flux, to name some examples. Flux-tunable superconducting circuit elements are designed to operate in the presence of a magnetic field, and it was found that producing a suitable magnetic field posed various challenges in practice.

This background information is provided to reveal information believed by the applicant to be of possible relevance. No admission is necessarily intended, nor should be construed, that any of the preceding information constitutes prior art or forms part of the general common knowledge in the relevant art.

SUMMARY

One approach to generate a magnetic field in a manner to provide a suitable operating environment for a superconducting circuit loop is to generate the magnetic field actively, i.e. by circulating an electrical current along a conductor which is independent from the superconducting circuit loop. The electrical current can be circulated in a magnetic field coil located close to the sample chip or along a flux bias line located on the same chip and passing close to the superconducting circuit loop for instance. Such an approach can pose particular challenges. Indeed, superconducting circuit loops typically operate in very cold (e.g., mK range) temperatures which are typically achieved with dilution refrigerators. The magnetic-field emitting conductor is thus positioned inside the dilution refrigerator, in close proximity with the superconducting circuit loop, but the driving element is located outside the dilution refrigerator, involving challenges in practice. In Quantum computing architectures the actively biased electrical conductor is a potential source of undesired interactions and cross-talk. Moreover, such biased electrical conductors typically have a significant footprint, and may require additional ports integrated to the same substrate as the superconducting loop, imposing potential limits to scalability. Moreover, particular challenges arise when considering applying an on chip flux bias line nearby superconducting circuit loops of 3D architectures, such as 3D qubits, where galvanic connections, by which electrical leads would typically be connected with the superconducting elements on a substrate, may not be available. Finally, the dissipation which can result from DC current flowing into a dilution refrigerator may require additional hardware to address and contribute to larger cost. It was found that at least in some embodiments, an alternate approach, notwithstanding its counter-intuitiveness, of using a permanent magnet to generate a fixed magnetic field component in a superconducting circuit environment could have advantages over flux biasing with electrical current circulation.

Various parameters can affect the effectiveness of the magnetic field on the superconducting circuit loop. In SQUIDs, for example, it can be desired to achieve a finely tailored and constant value of magnetic flux ($\phi$) within the superconductor flux loop, and this constant value may be in the order of magnitude of the magnetic flux quantum ($\Phi_0 = 2.068 \times 10^{-15}$ Wb), such as targeting a specific value of $\Phi/\Phi_0$ somewhere between 0 and 1 for instance. In many practical embodiments, it may not be practical to incorporate a magnetic field source within the same plane as the superconducting loop (e.g. same wafer surface). This can be caused, for instance, by losses generated by the presence of the material forming the permanent magnet in the vicinity of the superconducting loop, for instance. Accordingly, it may be preferred to position the magnetic field source on the other side of a substrate supporting the superconducting loop, in which case, in particular, it can be difficult to achieve a desired value of $\phi$ due to the geometrical implications of the magnetic field. Indeed, many magnetic field shapes will impart a $\phi/\phi_0$ value on the superconducting loop which will decrease as a function of a power of the distance r with the source, such as $\phi/\phi_0 \sim 1/r^n$ where n may vary between 3 and 5, for instance, depending on the details of the geometry. In at least some embodiments, it was found that guiding the magnetic field across the substrate with a superconducting through silicon via could allow achieving a relationship where n is closer to 1, which may be suitable at least in some embodiments.

In accordance with one aspect, there is provided a quantum device comprising: at least one wafer; a superconducting circuit having a circuit element supported by said at least one wafer, the superconducting circuit exhibiting superconductivity during operation of the quantum device; and a passive magnetic element supported by said at least one wafer at a given position relative the superconducting circuit in a manner to generate a magnetic flux across the circuit element during operation of the quantum device.

In accordance with another aspect, there is provided a method of operating a quantum device comprising: a passive magnetic element generating a permanent magnetic flux across a circuit element of the quantum device, the circuit element supported by a wafer.

In accordance with another aspect, there is provided a quantum device comprising: a substrate; a superconducting circuit element supported on a substrate surface of said substrate, the superconducting circuit element exhibiting superconductivity during operation of the quantum device; and a passive magnetic element, the passive magnetic element generating a magnetic field, the superconducting circuit element being directly or indirectly exposed to at least a portion of the magnetic field during operation of the quantum device.

In one embodiment, the superconducting circuit element comprises a superconducting loop having two branches splitting and recombining at corresponding points, each branch having at least one Josephson junction, wherein said portion of the magnetic field contributing a magnetic flux across the superconducting loop.

In one embodiment, the passive magnetic element and the superconducting circuit element are both supported by said substrate surface of said substrate.

In one embodiment, the passive magnetic element is positioned adjacent the superconducting circuit element.

In one embodiment, the superconducting loop comprises at least one low sensitivity axis, and wherein the passive magnetic element is positioned on said low sensitivity axis.

In one embodiment, the low sensitivity axis extends transversally across the two branches of said superconducting loop.

In one embodiment, the passive magnetic element has a magnetization direction perpendicular to said substrate surface.

In one embodiment, the passive magnetic element is a first passive magnetic element, further comprising a second passive magnetic element supported by the substrate surface, the second passive magnetic element positioned centrally relative to the superconducting loop.

In one embodiment, the device further comprises a third passive magnetic element supported by the substrate surface, the third passive magnetic element positioned adjacent to the superconducting loop opposite the first passive magnetic element.

In one embodiment, the passive magnetic element has a magnetization direction parallel to said substrate surface, and the magnetization direction is oriented along said low sensitivity axis of the superconducting loop.

In one embodiment, the passive magnetic element is located above or below a plane defined by said superconducting loop.

In one embodiment, the substrate is a first substrate, further comprising a second substrate held spaced apart from the first substrate, the passive magnetic element being supported by the second substrate.

In one embodiment, the passive magnetic element is located in a depression formed in said substrate surface.

In one embodiment, the superconducting circuit element is selected from the group consisting of: a flux qubit, a superconducting quantum interference device (SQUID), a superconducting nonlinear asymmetric inductive element (SNAIL), and a capacitively shunted SNAIL (SNAILMON).

In one embodiment, the superconducting element is one of a plurality of superconducting elements, the plurality of superconducting elements arranged in an array configuration on the substrate surface.

In one embodiment, the magnetic flux is in the order of magnitude of a magnetic flux quantum $\phi_0$.

In one embodiment, the passive magnetic element is a dot micromagnet or a bar micromagnet.

In one embodiment, a maximum magnetic field amplitude on a flux loop of said passive magnetic element during operation, max $(|\vec{B}|_{flux\ loop})$, is smaller than 1/10th of the critical field HC of a superconductor material of said superconducting circuit element.

In one embodiment, the passive magnetic element is a magnetic tunnel junction.

In one embodiment, the superconducting circuit element is indirectly exposed to the portion of the magnetic field, the portion of the magnetic field being guided, at least in part, from a first location proximate the passive magnetic element to a second location proximate the superconducting circuit element by one or more magnetic field guides, each of the one or more magnetic field guides operable to guide, at least in part, the portion of the magnetic field and comprising: a tubular passage extending across at least one substrate layer of the substrate, the tubular passage having a first end and a second end, and defining an inner surface inside the at least one substrate layer; a guide layer of material exhibiting superconductivity during operation of the quantum device, the guide layer covering, at least in part, the inner surface of the tubular passage, and extending from the first end to the second end.

In one embodiment, the device comprising one magnetic field guide, and wherein the substrate surface is a first substrate surface, the substrate further comprising a second substrate surface opposite the first substrate surface, the passive magnetic element being supported by the second substrate surface; and wherein the first end of the tubular passage is located on the first substrate surface proximate the superconducting circuit element, and the second end of the tubular passage is located on the second substrate surface proximate the passive magnetic element.

In one embodiment, the substrate comprises a first substrate layer and a second substrate layer, the first substrate layer comprising the substrate surface, further comprising: an inner magnetic field guide, comprising: a cavity formed between the first substrate layer and the second substrate layer, the inner cavity defining an inner cavity surface; a cavity guide layer of said material exhibiting superconductivity during the operation of the quantum device, the cavity guide layer covering, at least in part, said inner cavity surface; and wherein the quantum device comprises two magnetic field guides, wherein: a first magnetic field guide of the two magnetic field guides acts as a sink guide having the first end thereof coupled to the inner magnetic field guide and the second end thereof located on the substrate surface proximate the superconducting circuit element; a second magnetic field guide of the two magnetic field guides acts as a source guide having the first end thereof located on the substrate surface proximate the passive magnetic element, and a second end thereof being coupled to the inner magnetic field guide; and wherein the portion of the magnetic field is guided, at least in part, from the first end of the source guide to the second end of the sink guide via said inner magnetic field guide.

In one embodiment, the superconducting circuit element is configured to operate as a quantum subsystem of a quantum computer and wherein the superconducting circuit element is operable to host therein at least one qubit during operation of the quantum computer.

In accordance with another aspect, there is provided A quantum device, comprising: a substrate; a magnetic field guide, comprising: a tubular passage extending across at least one substrate layer of the substrate, the tubular passage having a first end and a second end, and defining an inner surface inside the at least one substrate layer; and a guide layer of material exhibiting superconductivity during operation of the quantum device, the guide layer covering, at least in part, the inner surface of the tubular passage, and extending from the first end to the second end, the guide layer operable to guide a portion of a magnetic field along the magnetic field guide.

In one embodiment, the device further comprises at least one magnetic field source configured to generate, at least in part, the magnetic field.

In one embodiment, the device further comprises at least one superconducting circuit element, the superconducting element being exposed to said portion of the magnetic field guided by said magnetic field guide.

In one embodiment, each of the at least one superconducting circuit element comprises a superconducting loop having a plurality of Josephson junctions, and wherein the portion of the magnetic field guided by the magnetic field guide imparts a magnetic flux across the superconducting loop during the operation of the quantum device.

In one embodiment, the first end of the tubular passage and the at least one superconducting circuit element are located on a same outer surface of the substrate, the superconducting circuit element proximate the first end.

In one embodiment, the first end of the tubular passage is located centrally relative to the superconducting loop.

In one embodiment, the first end of the tubular passage is located adjacent to the superconducting loop.

In one embodiment, the device further comprises a first superconducting circuit element and a second superconducting circuit element both supported on the outer surface, the first end of the tubular passage being positioned between the superconducting loop of the first superconducting circuit element and the superconducting loop of the second superconducting circuit element so as to expose both to the portion of the magnetic field simultaneously.

In one embodiment, the outer surface is a first outer surface, the substrate further comprising a second outer surface opposite the first outer surface, a second end of the tubular passage being located on the second outer surface, the magnetic field source located proximately to the second end.

In one embodiment, the passive magnetic field source is supported by the second outer surface adjacent the second end of the tubular passage.

In one embodiment, the substrate is a first substrate, the device further comprising: a second substrate held spaced apart from the second outer surface of the first substrate, the second substrate having a third outer surface adjacent the second outer surface of the first substrate; and the magnetic field source is supported by the third outer surface.

In one embodiment, the substrate comprises a first substrate layer and a second substrate layer, the first substrate layer comprising the outer surface; and wherein the tubular passage extending across the first layer only with a second end of the tubular passage being located between the first layer and the second layer; and the magnetic field source positioned proximate the second end of the tubular passage in said substrate.

In one embodiment, the at least one magnetic field source comprises a passive magnetic element.

In one embodiment, the at least one magnetic field source comprises an active magnetic element comprising an electrical conductor element connected to an electrical drive.

In one embodiment, an inner volume defined by the tubular passage is filled, at least in part, with a non-conductive material.

In one embodiment, the passive magnetic element is supported on a surface of said substrate, and the magnetic field guide is a first magnetic field guide having the first thereof located on said surface adjacent said passive magnetic element, and wherein the quantum device comprises a second magnetic field guide, the second magnetic field guide having the first end thereof located on the surface adjacent the passive magnetic source opposite the first end of the first magnetic field guide; the passive magnetic element being positioned so as to act as a transversely oriented magnetic field source so that the guided portion of the magnetic field by said first magnetic field guide and by said second magnetic field guide have respectively opposite flux polarities.

Many further features and combinations thereof concerning the present improvements will appear to those skilled in the art following a reading of the instant disclosure.

DESCRIPTION OF THE FIGURES

In the figures,

FIGS. 1A, 1B, 1C, and 1D are schematic circuit representations of a classical harmonic oscillator, a basic version of a transmon, and flux tunable superconducting circuit elements, respectively;

FIG. 2A to 2D are schematic representations of example potential configurations for applying a magnetic field onto a superconducting circuit, with FIG. 2A presenting an example of an actively driven magnetic field and FIGS. 2B-2D presenting examples of magnetic field emitted by corresponding configurations of permanent magnets, and more specifically a central dot magnet, a lateral bar magnet and a lateral dot magnet configurations, respectively;

Figure 1E:
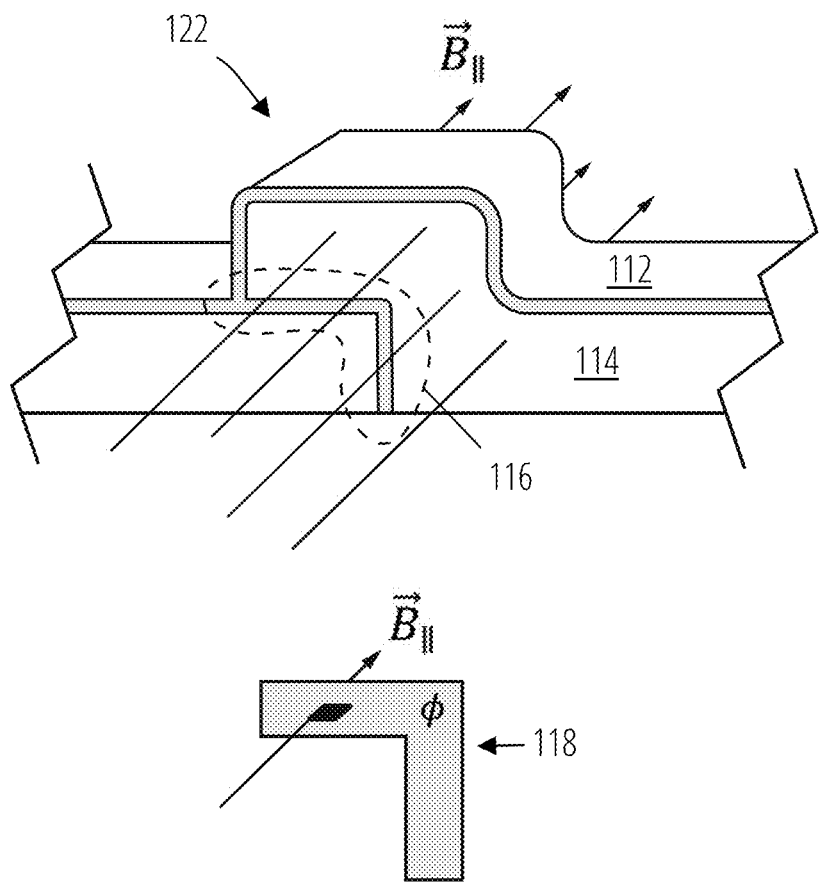
FIGS. 1E and 1F represent a Josephson junction and its frequency response to an external parallel magnetic field, respectively.

Elements in the several figures are illustrated for simplicity and clarity and have not necessarily been drawn to scale. For example, the dimensions of some of the elements in the figures may be emphasized relative to other elements for facilitating understanding of the various presently disclosed embodiments. Also, common, but well-understood elements that are useful or necessary in commercially feasible embodiments are often not depicted in order to facilitate a less obstructed view of these various embodiments of the present disclosure.

DETAILED DESCRIPTION

Various implementations and aspects of the specification will be described with reference to details discussed below. The following description and drawings are illustrative of the specification and are not to be construed as limiting the specification. Numerous specific details are described to provide a thorough understanding of various implementations of the present specification. However, in certain instances, well-known or conventional details are not described in order to provide a concise discussion of implementations of the present specification.

Furthermore, numerous specific details are set forth in order to provide a thorough understanding of the implementations described herein. However, it will be understood by those skilled in the relevant arts that the implementations described herein may be practiced without these specific details. In other instances, well-known methods, procedures and components have not been described in detail so as not to obscure the implementations described herein.

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

When introducing elements of aspects of the disclosure or the examples thereof, the articles "a," "an," "the," and "said" are intended to mean that there are one or more of the elements. The terms "comprising," "including," and "having" are intended to be inclusive and mean that there may be additional elements other than the listed elements. The term "exemplary" is intended to mean "an example of." The phrase "one or more of the following: A, B, and C" means "at least one of A and/or at least one of B and/or at least one of C."

FIGS. 1A-1D are a schematic representation of circuit elements. More specifically, FIG. 1A represents a classical electrical circuit of a harmonic oscillator including an inductance L and a capacitance C as well known in the art. The harmonic oscillator has a linear resonant frequency response defined as $\omega_0 = 1/\sqrt{(LC)}$.

In a superconducting circuit 102, where the circuit elements exhibit superconductivity during operation (typically involving very low temperatures), a slightly anharmonic oscillator referred to as a transmon can be achieved by introducing a Josephson junction instead of the inductance. The Josephson junction 104 in such a configuration can introduce non-linearities which can be used to encode and manipulate quantum information, for instance. The transmon can be formed of traces of a material which exhibits superconductivity at low temperatures which cover a substrate such as a semiconductor and insulator.

In its basic embodiment represented in FIG. 1B, the frequency $\omega_q$ is not adjustable. Other superconducting circuit elements involving Josephson junctions, have been developed in which a superconducting loop is introduced in the circuit. More specifically, the superconducting loop can include two branches which split and recombine at corresponding points on opposite sides of the superconducting loop. One (or more) Josephson junction can be introduced in each branch of the superconducting loop, which allows to create a configuration where the frequency $\omega_q$ depends on the magnetic flux $\phi$ through the superconducting loop. Other parameters and interactions may be adjusted with the magnetic flux $\phi$, such as setting the flux to adjust a superconducting device to a flux insensitive point (e.g. with $\phi/\phi_0=0.5$ in flux qubits), or the mixing capabilities such as, but not limited to, the third-order cubic interaction or the fourth-order Kerr interaction.

Examples of superconducting circuits involving a loop are provided in FIGS. 1C and 1D. More specifically, FIG. 1C presents an example of a transmon device which is typically referred to as a SQUID (Superconducting QuantUm Interference Device) in the art, and which has one Josephson junction in each one of two branches of the superconducting loop 106. FIG. 1D presents an example of a transmon device which is typically referred to as a SNAIL (Superconducting Nonlinear Asymmetric Inductive eLements) and which has one small Josephson junction in a first one of the two branches of the superconducting loop, and one or more large Josephson junctions in series in a second one of the two branches of the super conducting loop 106. A detailed example embodiment of a capacitively shunted SNAIL, the SNAILMON, is described in Grimm, A. et al. Stabilization and operation of a Kerr-cat qubit. Nature 584, (2020). The latter example embodiment of a SNAILMON will be used as a reference for demonstrating proof of concepts in this specification and will be referred to specifically as "the Grimm SNAILMON" for ease of reference.

Figure 1F:
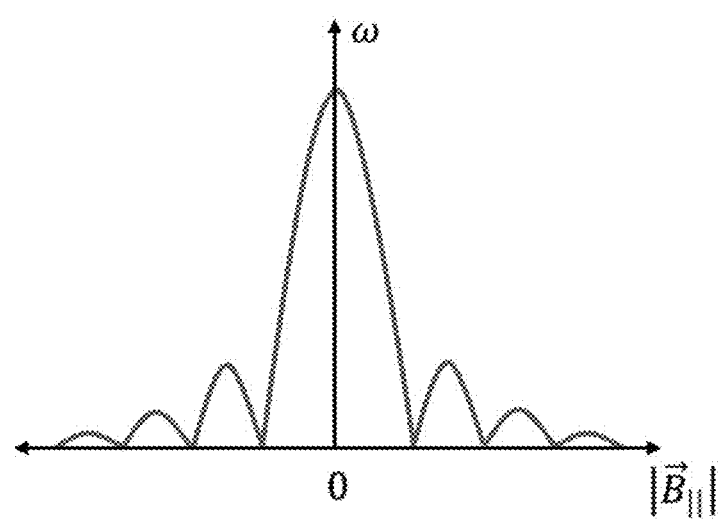

It will be understood however that other types of superconducting circuit elements may benefit from, or even require the application of a magnetic field in some other embodiments, including superconducting circuit elements having superconducting loops such as other versions of superconducting circuits, and that the teachings presented below may equally be applicable to such other embodiments. For example, FIG. 1E presents a particular example of a Josephson junction 122 which includes a tunnel junction 116 (shown with insulator layer 112 and superconductive layer 114) and which can exhibit a frequency response such as shown in FIG. 1F to a magnetic field aligned along the width of the tunnel junction 116. Although the magnetic field involved here can be significantly larger than the magnetic field used with superconducting loops of SQUIDs or SNAILs, due to the small active area for the flux defined by the tunnel junction cross-section 118 shown in the figure and which can be orders of magnitude smaller than a typical flux loop, such a Josephson junction can also benefit from the presence of a permanent magnetic field. In this sense, this specification is not to be interpreted as being limited to the limited subset of specific examples used for the purpose of demonstration.

Figure 1G:
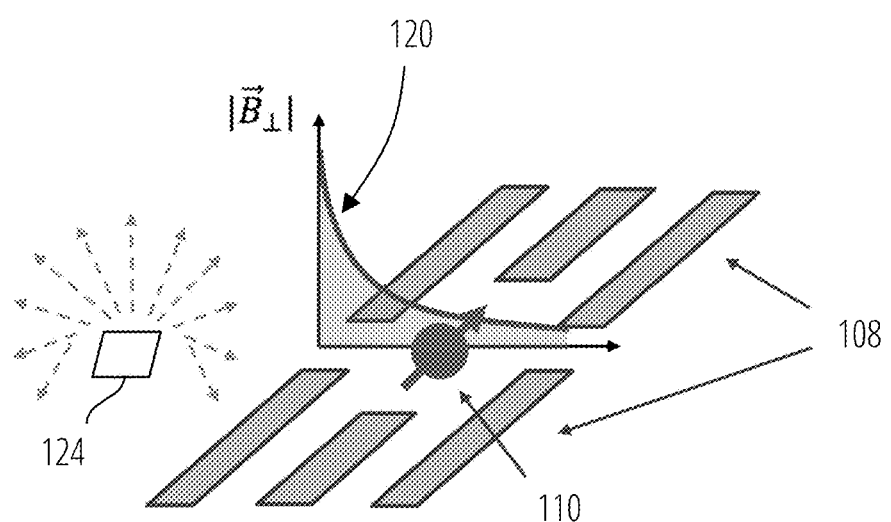
FIG. 1G schematically represents a magnetic field applied to a quantum dot in a spin qubit.

It will be understood that quantum devices having circuit elements other than superconducting circuit elements may also benefit from, or even require the application of a magnetic field in some other embodiments. For instance, FIG. 1G presents an example of a qubit. A magnetic field source 124 can be used to generate a transverse magnetic field 120 as illustrated, to a quantum dot 110 in the spin qubit. Also shown in FIG. 1G are the control gates 108. The magnetic field gradient can contribute to control the spin qubit, for instance.

In a manner which, to a certain extent can remind one of fabrication techniques used in conventional electronics, superconducting, or non-superconducting circuit elements of quantum devices can be supported by a passive component referred to as a wafer and which can be made of an electrical insulator or semiconductor material, the most common of which may be silicon and sapphire. Micro and nano-fabrication techniques may be required for making superconducting circuit elements and therefore it can be required in some embodiments for the wafer to be compatible with such micro and nano-fabrication techniques.

FIG. 2A presents a first technique by which a magnetic field B can be generated in a manner to impart a magnetic flux $\Phi$ through a circuit element of a superconducting circuit. In this technique, the electrical drive, such as a current source for example, is located outside the refrigerated volume of a dilution refrigerator. Electrical leads extend across the wall of the dilution refrigerator. The superconducting circuit (typically provided in the form of a pattern of tracks or lines of a material which exhibits superconductivity during operation) can be defined one or more wafers, each of which can have one or more wafer layer (the wafer is not shown for simplicity), and the conductor which is responsible for generating the magnetic field based on the electrical drive's input can also be integrated to the same wafer, and connected to the electrical leads at both ends, typically via galvanic connections. Henceforth, during operation of the device, the electrical bias source 202 which can be at ambient temperature (e.g., in the order of 300 K) generates a current in the electrical circuit that generates a magnetic field. The circuit includes the electrical leads 208 which extend across the dilution refrigerator wall 206 and the galvanic connections, and the conductor bias lines 210 on the wafer. The current circulating along the conductor bias lines 210 generates a magnetic field B. The conductor lines 210 are positioned at a carefully designed location relative to the superconducting loop 204 in a manner for the magnetic field B to generate a magnetic flux $\phi$ through the superconducting loop 204 which amplitude depends of the bias current I. This magnetic field generation technique can be qualified as "active", by contradistinction with "passive", since it requires an actively provided electrical current circulation to generate the magnetic field.

FIGS. 2B, 2C and 2D represent example embodiments of another technique by which a magnetic field B can be generated in a manner to impart a magnetic flux $\phi$ through a circuit element (e.g., comprising a superconducting loop 214) of a superconducting circuit. In FIGS. 2B and 2D, the magnetization direction of the magnet is perpendicular to the surface which supports superconducting loop, whereas in FIG. 2C, the magnetic field orientation is parallel to the surface which supports the superconducting loop. In each case, the magnets are sized and positioned in a manner to impart a suitable magnetic flux. In FIGS. 2B, the magnet 212 is positioned centrally relative to the loop 214, whereas in FIGS. 2C and 2D, the magnets 216 and 218, respectively, are positioned adjacent the loop 214 (for example at a distance l as illustrated in FIG. 2C). In the examples of FIGS. 2B, 2C and 2D, a permanent magnet (e.g., magnet 212, 216 or 218, respectively) is used instead of electrical current to generate the magnetic field B. The technique can be qualified as "passive" in the sense that it does not actively require the circulation of electrical current in a classical circuit to sustain the magnetic field. To those versed in the art, it was highly counter-intuitive to imagine that such a technique of generating a magnetic flux can be a suitable solution in a superconducting circuit of a quantum device. This counter-intuitiveness can stem from groups of reasons including feasibility, variability, and losses, and perhaps also a paradigm which existed in the field.

Firstly, in terms of feasibility, it will be noted that in many practical embodiments flux-biased of quantum devices, and in particular the ones which involve flux loops, the targeted magnetic flux can be in the order of the flux quantum $\phi_0$, where $\phi/\phi_0$ can be in the range [0,1]. On one hand, achieving a smaller magnetic flux can lead one to use a smaller magnet volume, but on the other hand, smaller magnets can be difficult/costly to produce, and at small dimensions, the variability in the production process can lead to a more significant variability in dimensions from one magnet to another. It can be significantly more difficult, for instance, to produce magnets having dimensions of below 100 nm in terms of width, height, length, or diameter for instance. Variability in dimensions can directly affect the precision and value on the magnetic flux during operation in the final assembly. Another significant factor is the amplitude B of the field along the superconducting circuit which may disrupt superconductivity if the magnetic field amplitude on the superconducting loop exceeds the critical field $H_c$ of the superconductor ($B > \mu_0 H_c$). Finally, the presence of the magnet itself in the electromagnetic environment of the superconducting circuit may cause disruptions to the operation of the device in the form of losses.

Before moving onto a case study, it will be noted that in the example embodiments presented in FIGS. 2B, 2C and 2D, the permanent magnets are positioned on the same wafer surface than the one onto which the superconducting circuit element which they are intended to bias are supported by. This configuration can be referred to as "in-plane" here, especially in a context where the wafer surface is planar. In other embodiments, such as will be exemplified below, the position of the magnet elements relative this wafer surface can vary such as being recessed within a wafer or positioned in alignment with another wafer surface or plane. In some other embodiments, the wafer surfaces may not be planar such as by being curved.

Case Study—Introduction

A case study was performed to determine whether using a permanent magnet as the source of a magnetic flux $\Phi$ through a superconducting loop could be a suitable avenue for one specific embodiment. In this specific embodiment, various configurations of permanent magnets were considered as magnetic flux sources used to impose (commonly referred to in the art as "tune") the frequency $\omega_q$ and cubic interaction of the Grimm SNAILMON referred to above. In this specific embodiment, used for example to acquire the results shown in FIGS. 4 and 5 where $b = w_{loop} = 7.94$ μm and $a = h_{loop} = 8.20$ μm. The magnetic flux quantum $\Phi_0$ is ~$2.068 \times 10^{-15}$ Wb, and the magnetic flux $\phi$ is defined as the surface integral of the normal component of the magnetic field B inside the region defined by the superconducting loop. The electromagnetic simulations are based on magnets made of FeCo with a remanence magnetization of $M_R \approx 1.98$ T, which was considered convenient for testing smaller magnet dimensions. Indeed, the magnet dimensions need to increase if the remanence magnetization decreases to achieve a same surrounding magnetic field, and higher remanence magnetization materials may be favored in this context. The case study somewhat arbitrarily set targets which appeared to its authors to be tied to a subjective sense of suitability for this specific embodiment. In this context, the case study can set a target of the target magnetic flux in the order of the flux quantum, e.g. $\phi \in [0, 1]$ $\phi_0$, a maximum magnetic field amplitude on the flux loop conductor an order of magnitude lower than the critical field $H_c$ of the superconductor, e.g. $\max(|\vec{B}|_{flux\ loop}) < 0.1\ H_c$; a minimum magnet dimension 100 nm (e.g. t, w, h [thickness, width and height of magnet]>100 nm tied to an expected difficulty or increased cost in producing magnets below such dimensions), a variability of the magnetic flux stemming from the variability in the magnet fabrication process of $2\sqrt{\text{Var}(\Phi)} = 2\sigma < 0.05\Phi_0$; and electromagnetic losses due to the presence of the magnet(s) $\kappa_m^{tot}/2\pi < 20$ kHz.

Feasibility

In order to optimize magnet design and configuration in relation to its intended function, it can be preferred to take into consideration the effects of eventual fabrication process variations in the ultimate context. The choice of shape, orientation, and position of the magnet relative to the superconducting loop can affect sensitivity to fabrication process variations, and a scenario where sensitivity to fabrication process variations is minimized may be preferred. To assess such factors, the case study evaluates the magnetic flux partial derivative for each key parameter: t, w, h, x, y, z (the latter three being position coordinates of the magnet relative the center of the flux loop), $h_{loop}$ and $w_{loop}$.

Figure 3:
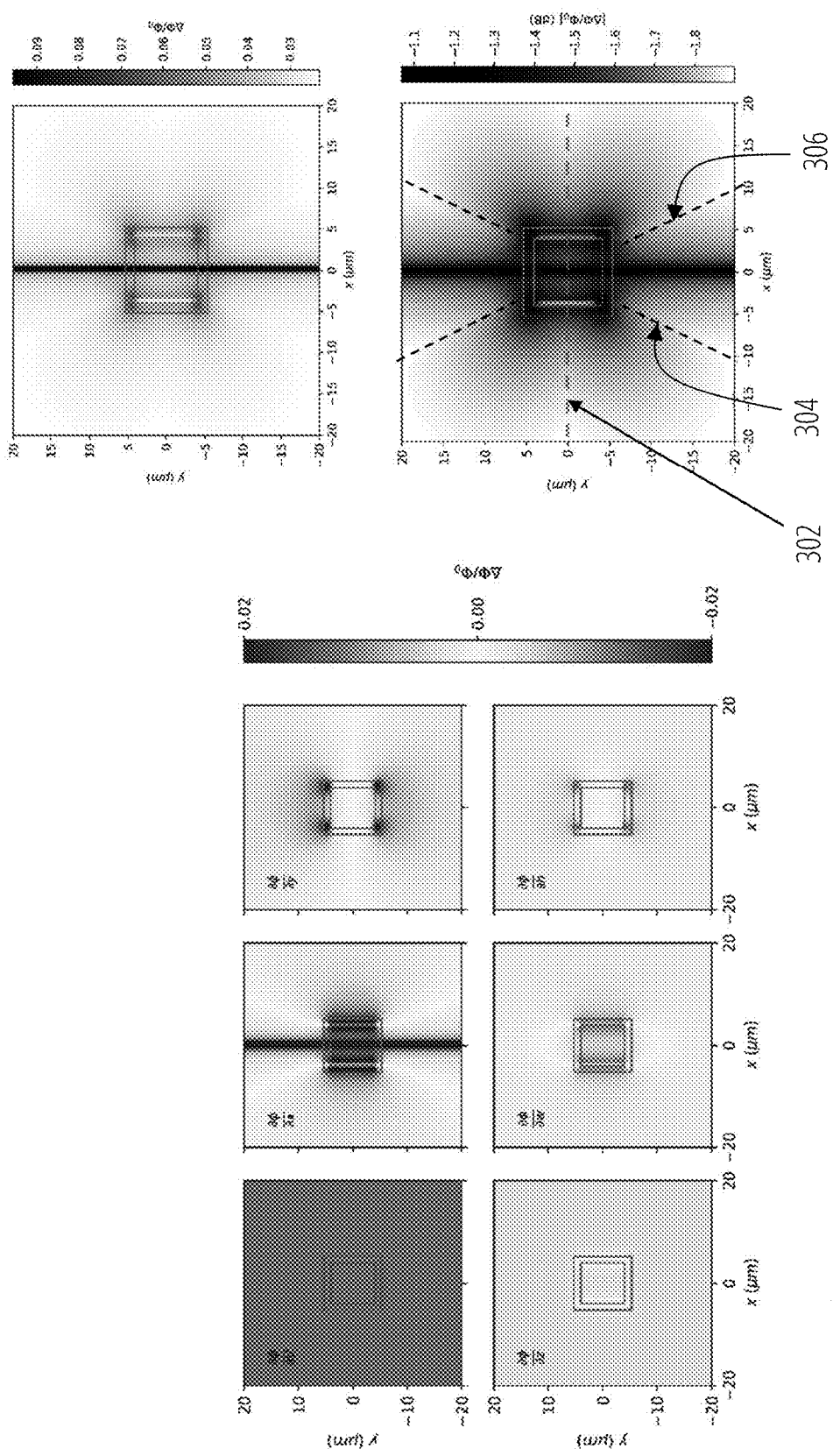
FIG. 3 presents graphical results of simulations of magnetic flux sensitivity to device parameter variability as a function of the position of a permanent magnet relative a superconducting loop for a dot magnet.

FIG. 2C presents a first embodiment of a magnet shape, position, and orientation 20 subject to the case study. In this case, the magnet is a bar magnet which is positioned laterally relative to the superconducting loop, on the same wafer surface than the one supporting the superconducting loop. The case study sets conservative fabrication variability of $\Delta V = 0.05 \times V_0$ (5% of magnet volume V), $\Delta x$, $\Delta y$, $\Delta w_{loop}$, $\Delta h_{loop} = 50$ nm, and $\Delta z = 10$ nm;

$$\Delta \Phi = \frac{\partial \Phi}{\partial Q} \Delta Q;$$

and $Q \in \{V, x, y, z, h_{loop}, w_{loop}\}$, where delta is the variance of the parameter and a Gaussian distribution is assumed for convenience. The results of the case study analysis for this embodiment are presented in FIG. 3, which illustrates that a zone extending transversally across the superconducting loop, more specifically transversally across the branches thereof, and centered around a low sensitivity axis 302 can be preferred to reduce the effects of manufacturing variability in the ultimate mode of operation. Other low sensitivity axes or zones can also exist, such as schematized here with additional dashed lines 304 and 306. Accordingly, it can be preferred, in a bar magnet configuration, to position the bar magnet adjacent the superconducting loop in a manner that its length extend along the low sensitivity axis. Symmetrical circuit elements can have low sensitivity axes, whereas in non-symmetrical elements, low sensitivity zones can also be present. Low sensitivity zones which are not centered along axes may also exist in symmetrical circuit elements.

Figure 4:
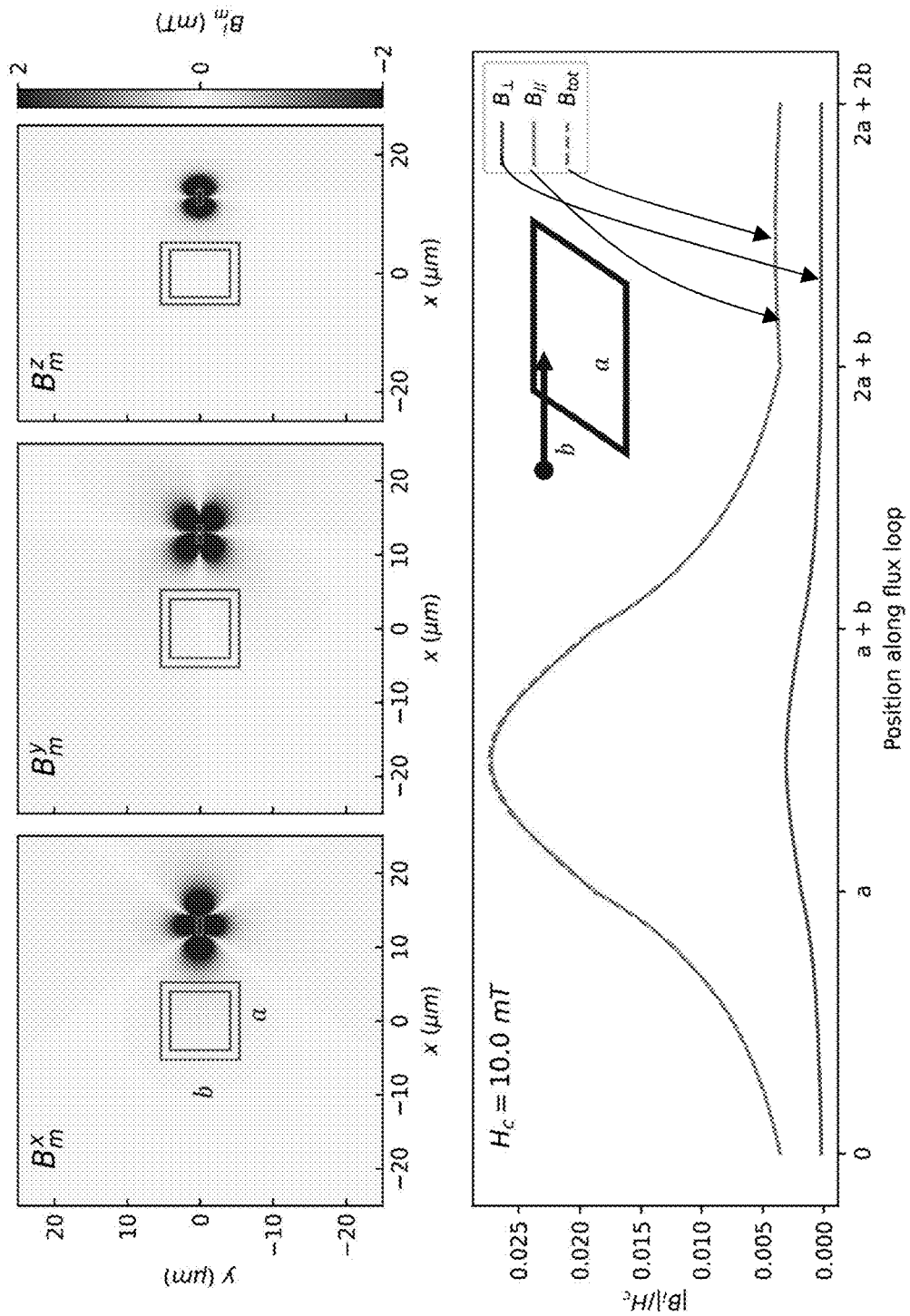
FIGS. 4, 5 and 6 graphically represent numerical results of magnetic field simulations for a lateral bar magnet, central dot magnet and lateral dot magnet configurations, respectively.

Referring to FIG. 4, from derivative analysis, an optimal bar magnet configuration was determined with a magnet thickness of 0.3 μm (target>0.1 μm), a width of 0.65 μm (target>0.2 μm) a length of 1.94 μm (target>0.2 μm) and a Z-offset from the wafer surface of 0.5 μm, which were feasible dimensions. The magnet configuration led to values of $$\frac{\Phi}{\Phi_0} = 0.260 \text{ and } \frac{\max(|\vec{B}|_{flux\ loop})}{H_c} \approx 0.027 < 0.1,$$

thus meeting all targets set in the case study.

Figure 5:
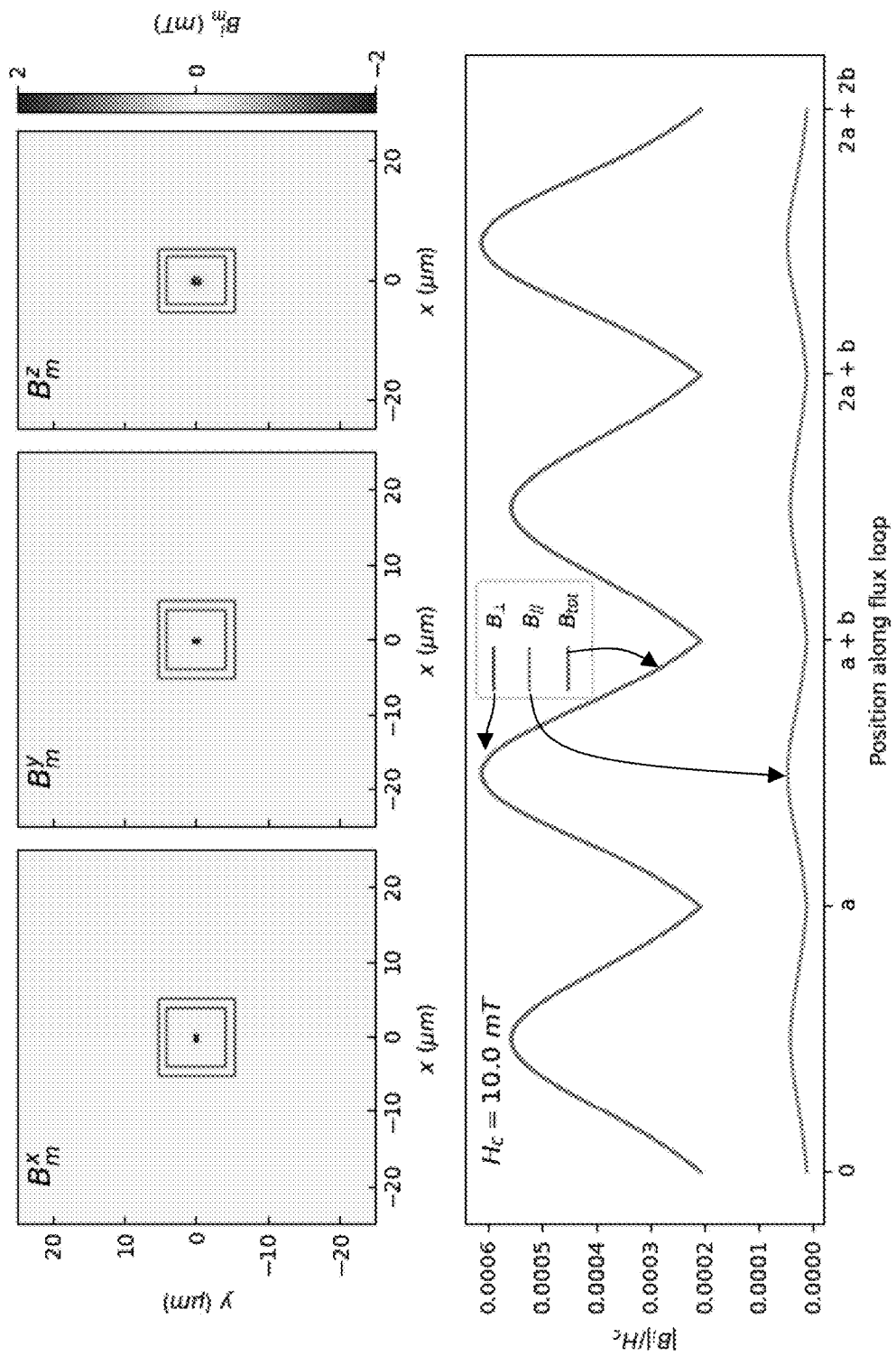
Figure 6:
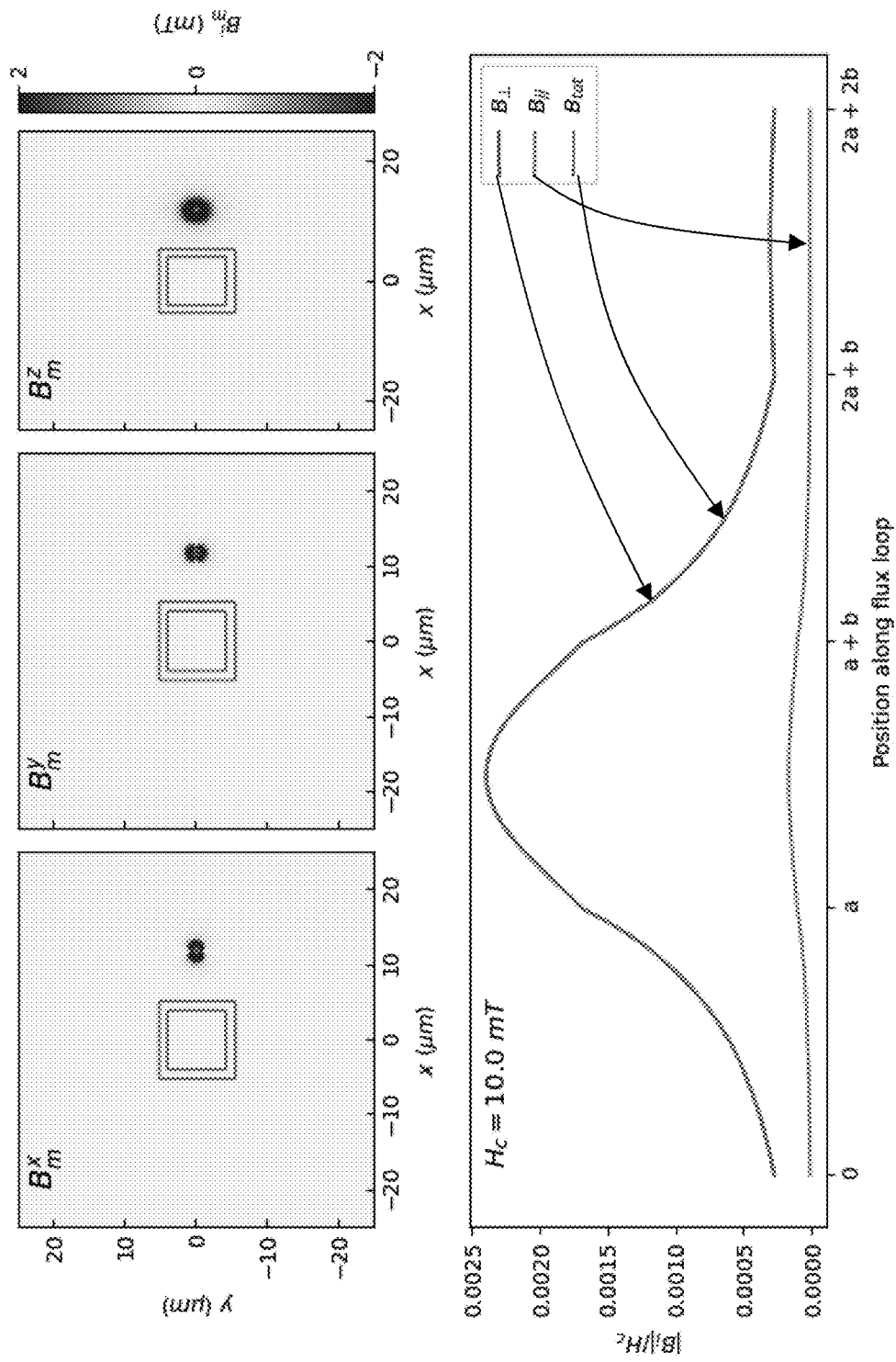
Figure 7A:
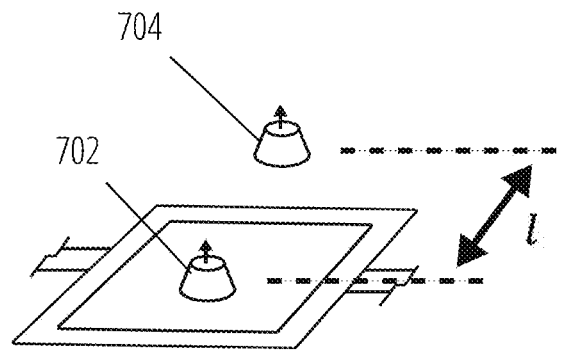
FIGS. 7A and 7B present examples of magnetic field emitted by corresponding configurations of permanent magnets, and more specifically a compensated central dot configuration and a dual-compensated central dot configuration, respectively.
Figure 7B:
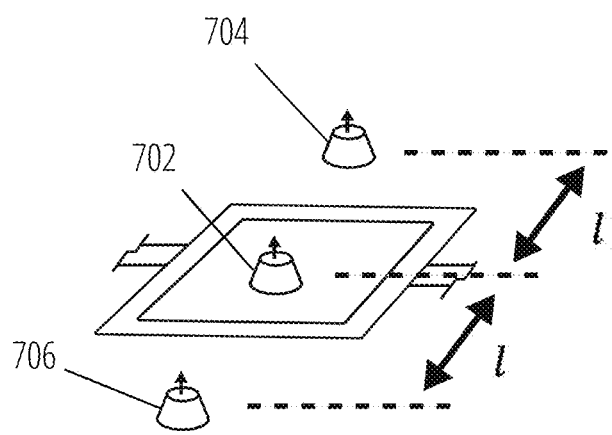
Figure 8:
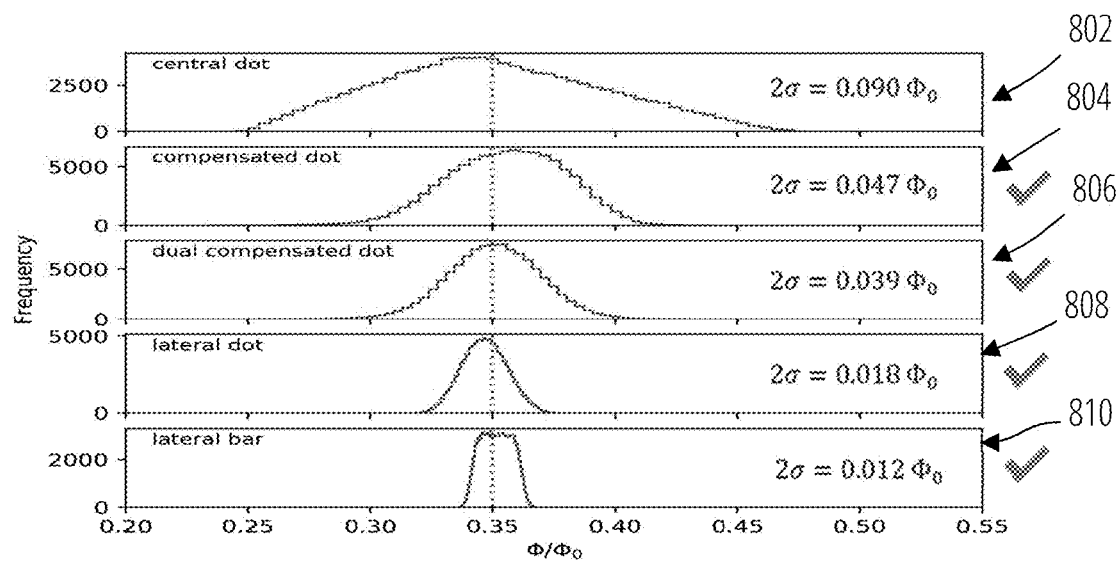
FIG. 8 presents variability in magnetic flux for various permanent magnet configurations.

A similar simulation was performed with a central dot magnet configuration, such as schematized in FIG. 2B, and the results are presented in FIG. 5, and another simulation was performed with a lateral dot magnet configuration, such as schematized in FIG. 2D, and the results are presented in FIG. 6. These two additional simulations also satisfied all requirements set by the case study, confirming the potential of permanent magnets for generating magnetic flux in association with superconducting loops in terms of feasibility.
Variability The case study targets $2\sigma < 0.05\phi_0$ as exposed above, and was performed on 5 different permanent magnet configurations. The first one is referred to as central dot and is as presented in FIG. 2B (e.g., central dot 212), where the w (and h) are of 130 nm. The second one is referred to as compensated central dot and is as illustrated in FIG. 7A and includes a central dot magnet 702 separated by a lateral dot magnet 704 by a spacing l of 4.62 μm. The $w_1$ of the central dot 702 is of 216 nm and the $w_2$ of the lateral dot 704 is of 132 nm. The third one is referred to as dual compensated dot and as illustrated in FIG. 7B, it further includes a second lateral dot 706 opposite the first lateral dot 704. In this third case, the $w_1$ of the central dot 702 is 308 nm, the $w_{2,3}$ of the lateral dots 704 and 706 is of 247 nm, and the spacing l is of 5.43 um. The fourth one is a lateral dot 218 as presented in FIG. 2D, with a w of 625 nm. The fifth one is a lateral bar 216 as presented in FIG. 2C with w=3.73 μm, h=11.2 μm and l=21.9 μm. The same thickness t of 200 nm was used across designs. A Monte Carlo Simulation was performed with a sample size of 100 000 units with a variation, in a uniform distribution, of ±20 nm for $\Delta w$, $\Delta h$, $\Delta w_{loop}$, of ±30 nm for $\Delta x$ and $\Delta y$ considering the position of the whole magnet arrangement, a $\Delta t$ of ±5 nm, and a $\Delta l$ of ±10 nm. The results of the Monte Carlo Simulation are plotted in FIG. 8 for the five different designs (e.g., plots 802, 804, 806, 808 and 810). The flux variability target is achieved for the four latter designs (e.g., 804, 806, 808 and 810). Decreasing $M_R$ would decrease variability and could therefore allow even the first design (e.g., 802) to meet the case study target.
Losses The loss simulations were performed using Ansys High Frequency Structure Simulator (HFSS) using the Grimm SNAILMON design evoked above.

Total loss $\kappa_m^{tot}$, will be modelized as $\kappa_m^{tot} = \Sigma_l (\kappa_{ml}^{cap,surf} + \kappa_{ml}^{ind,surf})$, where m is the eigenmode of interest, where the surface capacitive loss due to surface dirt and defects is modelized as $$\kappa_{ml}^{cap,surf} = \frac{\omega_m}{Q_l^{cap,surf}} \frac{t_l \epsilon_l}{4 E_{elec}} \mathrm{Re} \int_{surf_l} |\vec{E}_{max}|^2 ds,$$

and surface conductive loss is modelized as $$\kappa_{ml}^{ind,surf} = \frac{\omega_m}{Q_l^{ind,surf}} \frac{t_l \mu_l}{4 E_{mag}} \mathrm{Re} \int_{surf_l} |\vec{H}_{max,\parallel}|^2 ds,$$

where $\omega_m$=angular frequency of the mode; $t_l$=thickness of the dissipative layer on the lossy element; $\epsilon_l$, $\mu_l$, $\sigma_l$=permittivity, permeability and conductivity of the lossy element, $\lambda_0$=skin depth of metal surface 1, $Q_l$=intrinsic quality factor of a loss mechanism of the lossy element, $E_{elec(mag)}$=total electric(magnetic)-field energy of the mode, $\vec{E}_{max}$=eigenmode electric phasor and $\vec{H}_{max,\parallel}$=eigenmode magnetic phasor parallel to the surface.

Figure 9A:
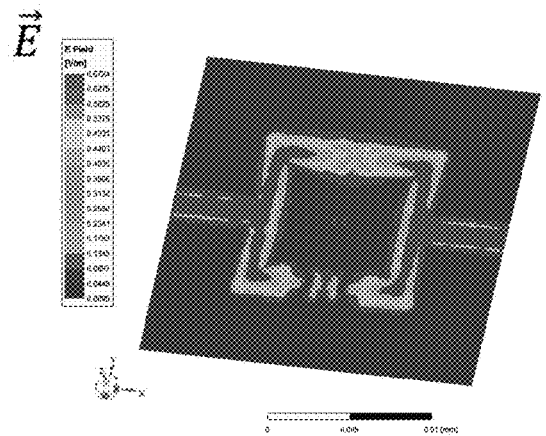
FIGS. 9A and 9B present a graphical representation of simulation results for losses.
Figure 9B:
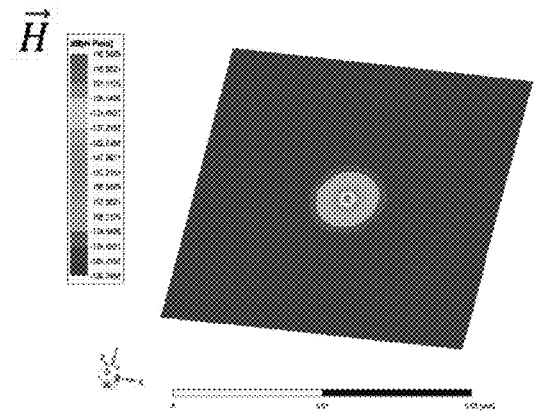

The results are illustrated in FIGS. 9A and 9B, and presented numerically in the following table:

TABLE 1

| results of loss calculation for case study | | | | | | |
|---|---|---|---|---|---|---|
| | $\kappa_{subsrat}^{cap, V}/2\pi$ (Hz) | $\kappa_{circuit, MA}^{cap, S}/2\pi$ (Hz) | $\kappa_{circuit, MS}^{cap, S}/2\pi$ (Hz) | $\kappa_{magnet}^{cap, S}/2\pi$ (Hz) | $\kappa_{magnet}^{ind, S}/2\pi$ (Hz) | $\kappa_{tot}/2\pi$ (Hz) |
| $Q_{0,\,magnet}^{ind,\,S}=1$ | 766 | 1 831 | 25.6 | 8.11 | 19 488 | 22 118.71 | where V is volume, S is surface, cap is capacitive loss (electric field loss), ind is inductive loss (magnetic field loss), MA is metal-air interface, MS is metal-wafer interface, and m is assumed to be the eigenmode of interest which is at $$\frac{\omega}{2\pi} \approx 6 \text{ GHz}.$$

Figure 10:
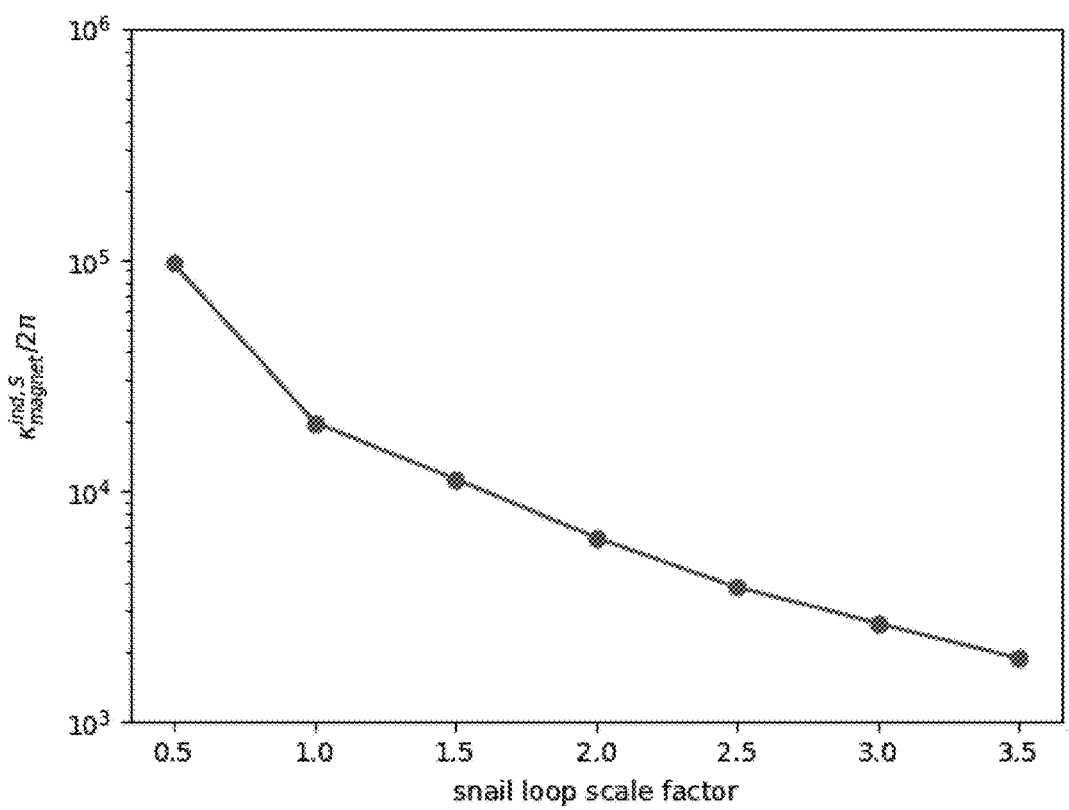
FIG. 10 is a graph showing the simulated relationship between losses and a SNAILMON loop scale factor.

It was found that the losses did not satisfy the target which had been selected for the purpose of the case study. However, since, as shown in FIG. 10, the $\kappa_{magnet}^{ind,S}$ decreases exponentially as a function of the SNAILMON loop scale factor, the losses due to the presence of the magnet can be reduced to acceptable values simply by increasing the flux loop size, which can be considered an acceptable tradeoff at least in some embodiments. It will also be noted that another way to address loss issues is to position a magnet on the other side of the wafer which supports the superconducting circuit and to use superconducting magnetic guide to guide the magnetic field emitted by the magnet to the region of the superconducting loop. The latter method will be presented below in further detail below and will be noted to open up more possibilities of applying the permanent magnet technique to various embodiments and applications.

Case Study—Conclusion

The case study leads to conclude that using one or more permanent magnet in applying a magnetic flux across a superconducting loop is a suitable approach at least in some embodiments.

Even though the case study addresses the use of a permanent magnet as a suitable source of magnetic flux $\phi$ in a somewhat specific context, it will be understood that its results can be extrapolated to many other comparable contexts and therefore, the case study demonstrates the suitability of the use of a permanent magnet as a source of magnetic flux $\phi$ in many superconducting loop embodiments, more generally. Moreover, it will be specifically noted that some of the targets, limits and/or restrictions which were imposed in the specific example used in the case study presented above may not be present, or may be alleviated, in some alternate embodiments.

Types of Magnetic Fields

Depending on the details and type of quantum device onto which the passive magnet elements are used to generate a magnetic flux, various potential scenarios are possible. In some embodiments, the magnetic field source can be intended to impart solely a fixed magnetic field component for the entire duration of the given operation phase. To this end, one or more permanent magnets positioned in suitable locations relative the superconducting circuit element(s) may allow to entirely substitute the active magnetic field elements including DC source, electrical leads, conductor trace and galvanic connections, which may be highly advantageous in some embodiments. In other embodiments, the intended magnetic field may include a fixed component and a variable component, such as an AC component or other variable component superposed to a DC bias for instance. In such latter embodiments, it may remain relevant to use an active magnetic field element to impart the variable component of the magnetic field. However, using passive magnet elements may still be helpful such as to reduce or eliminate the requirement of incorporating a DC component to the active magnetic field device. Accordingly, any permanent magnetic field component, such as a portion or the entirety of a DC bias equivalent, may be applied using one or more passive magnet elements, while a variable magnetic field component can continue to be applied using an active magnetic field device. In this manner, the active magnetic field device may be simplified or alleviated, for instance. Accordingly, various implementation schemes are possible and the details thereof are left to the persons in charge of designing specific embodiments based on the teachings of this specification.

Moreover, it will be understood that while permanent magnets, such as ferromagnets, can constitute good candidates for use as a passive magnet element, they are not the only possible candidates. For instance, in an embodiment, it can be considered interesting or suitable to use a magnetic tunnel junction as a passive magnet element. Indeed, while the magnetic field of a magnetic tunnel junction can be switched by imparting an electrical current, once it has been switched, it will continue to generate its magnetic field without the active circulation of an electrical current. For instance, using a stack of magnetic tunnel junctions interspersed with permanent magnets or equal magnetic field strength, and where the magnetic field orientation of the magnetic tunnel junctions can selectively be switched to cancel out, or amplify, the magnetic field of an adjacent permanent magnet, could allow providing a system where the magnetic field strength could be digitally tuned by controlling the magnetic field orientation of the magnetic tunnel junctions.

Potential Architectures

Figures 11A, 11B, 11C:
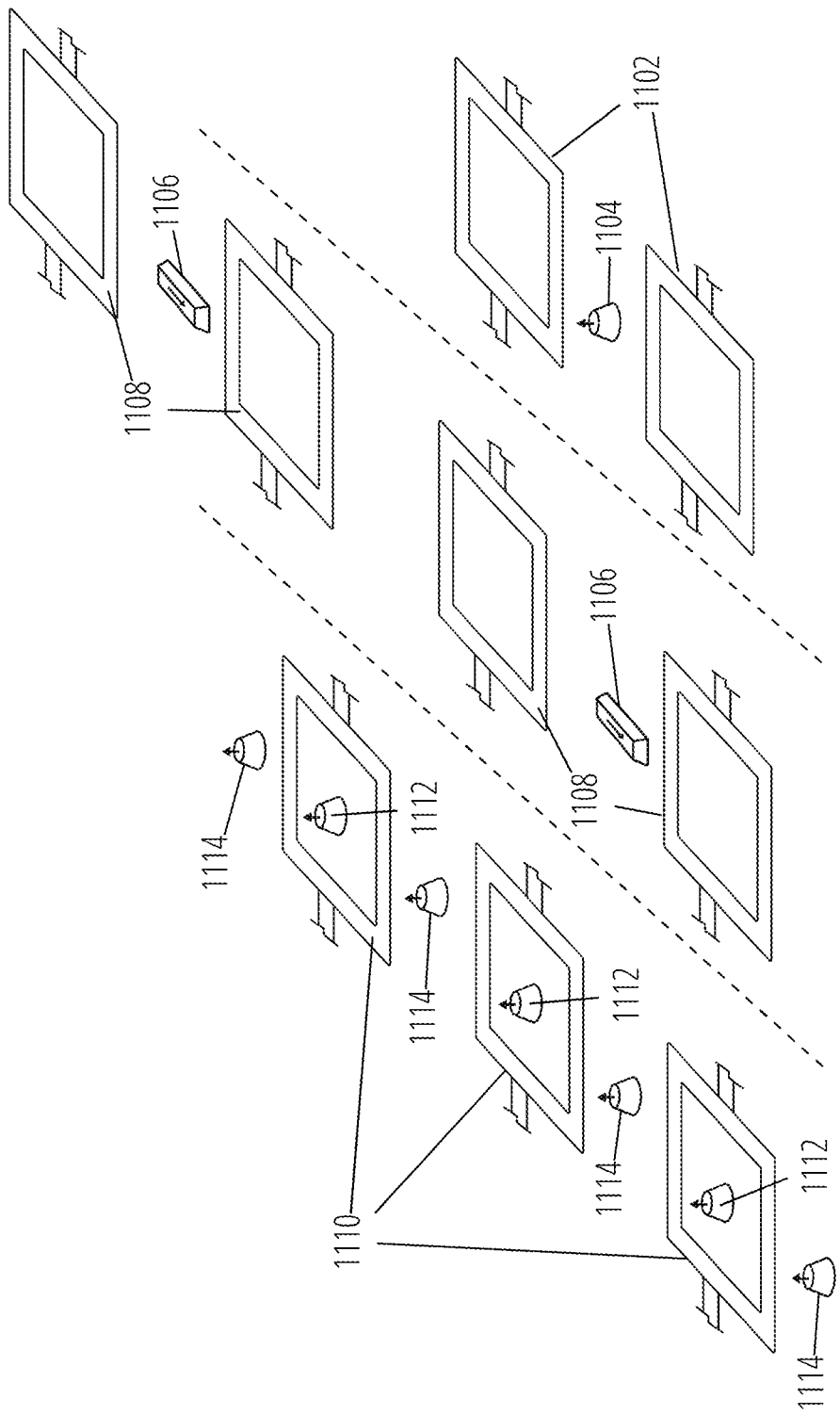
FIGS. 11A, 11B and 11C are examples of uni-dimensional array configurations sharing permanent magnets between more than one superconducting loop.

Referring to FIGS. 11A-11C, it will be understood that in some embodiments, it can be preferred to use one or more magnets which are positioned and configured in a manner for their static magnetic field to suitably affect more than one superconducting loop which may or may not be part of the same superconducting device (e.g. Flux Qubit, SQUID, SNAIL or SNAILMON), and such approaches may lead in some cases to smaller device footprint, which may be desirable in some embodiments. For instance, in FIG. 11C, a plurality of superconducting loops 1102 are positioned adjacent one another, and "lateral dot" type magnets (e.g., dot magnet 1104) are positioned between adjacent superconducting loops to simultaneously contribute to the magnetic flux through both adjacent superconducting loops 1102. In such an embodiment, the loops can form part of different qubits for instance, or form part of the same qubit. In FIG. 11B, transversally oriented bar magnets 1106 are used to impart a magnetic flux to pairs of adjacent superconducting loops. In FIG. 11A, dual-compensated central dot geometry (e.g., using central dot magnets 1112) is extended to a plurality of adjacent superconducting loops 1110 by sharing lateral dots 1114.

Many other alternative architectures are possible. Indeed, while the three examples presented in FIGS. 11A-11C present relatively simple one-dimensional arrays, the concept can be extended to two-dimensional, and even three-dimensional arrays, and to curved virtual surfaces rather than planar virtual surfaces.

Figure 12A:
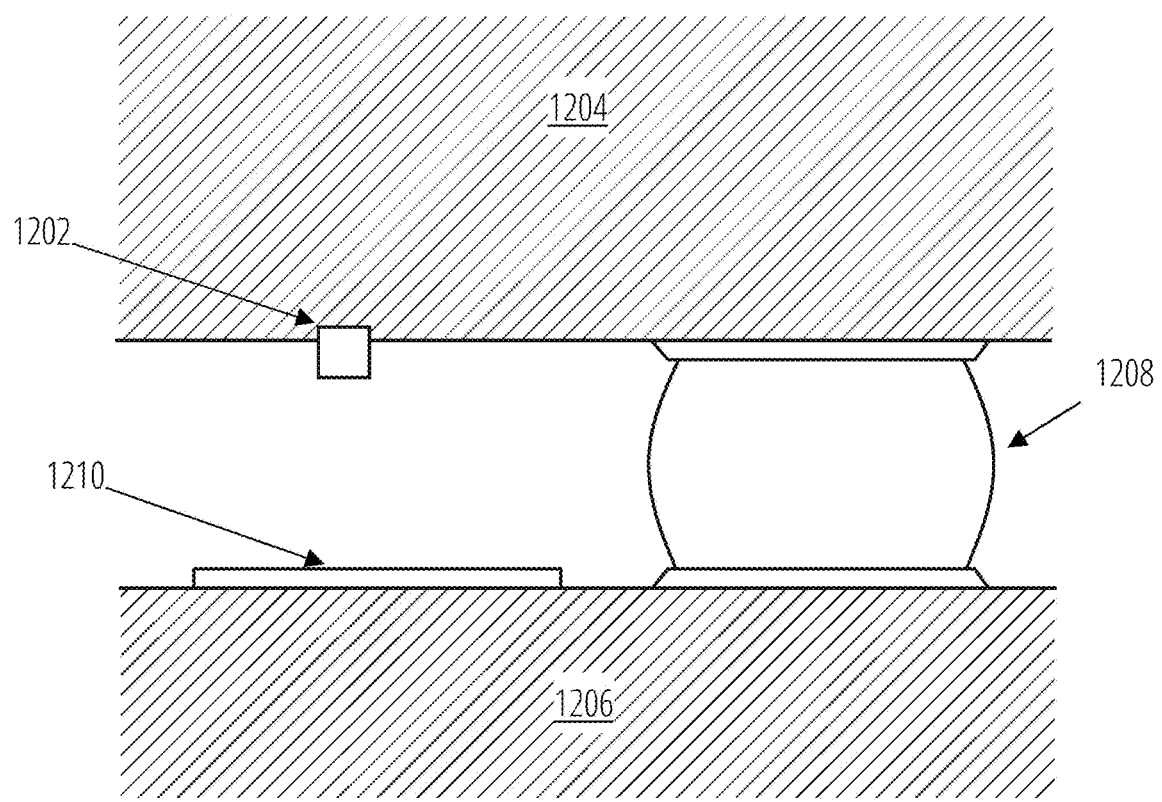
FIG. 12 is a cross-sectional view showing an example of an out of plane geometry.

Moreover, in embodiments presented and described above, the one, or more, magnet(s) were typically positioned relatively "in-plane", meaning roughly in alignment with the wafer surface supporting the superconducting loop, and "on chip", meaning on the same wafer. In in-plane geometries, perhaps the easiest geometry to imagine is patterning the permanent magnet onto the same wafer as the superconducting traces forming the superconducting circuit element(s) are supported. In other embodiments, however, it can be preferred to a certain extent to embed the permanent magnet into such a wafer, as opposed to patterning it onto a common planar and flat surface. This may be achieved by locating the permanent magnet into a well or other depression formed in the wafer, for instance. Still many other embodiments are possible, such as in particular out of plane embodiments. FIG. 12A, in particular, presents one such other possible embodiment. In the embodiment presented in FIG. 12A, two wafers (1204 and 1206) are used and are spaced apart by a solder ball 1208 or other spacing element. Each wafer has a surface facing the other wafer. The superconducting circuit element 1210 such as the superconducting loop can be applied onto a first one of these surfaces, and the magnet 1202 can be affixed to the other one of these surfaces, to name still another potential embodiment.

Figure 12B:
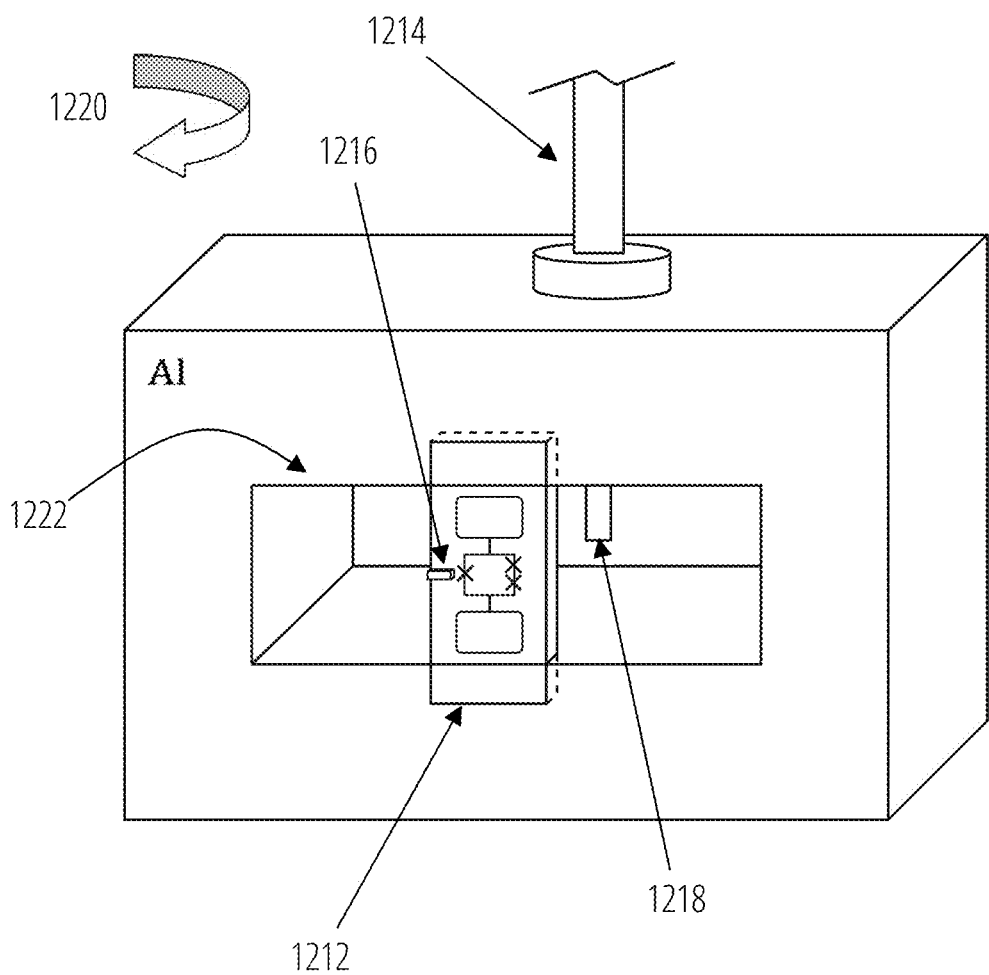

FIG. 12B presents yet another example embodiment where a micromagnet 1216 supported by a same surface of a wafer also supporting a SNAILMON housed in a rectangular 3D cavity 1222 as an electrically floating isolated chip 1212. Also shown in FIG. 12B is a coaxial cable 1214, a connector tip/RF antenna 1218 and the arrow 1220 is to illustrate closing the cavity. Such an embodiment can be used for embodying a 3D geometry qubit, for instance, and where the passive magnetic element can be used in a process of static flux control, for instance.

Magnetic Field Guide

As evoked above, the exact choice of the relative position of the one or more magnetic field sources, whether passive (e.g. magnet, magnetic tunnel junction) or active (e.g. conductor driven with current circulation) and the one or more circuit element (e.g. superconducting loop, Josephson junction, spin qubit) may be suitably left to the designer in view of the particular context of a specific embodiment or application, and many potential configurations are possible.

In some embodiments, it can be preferred to position the magnetic field source on a side (e.g. second side) of the wafer which is opposite the surface of the wafer which supports the circuit element through which a magnetic flux is to be applied, and to convey the magnetic field across one or more layers of the wafer using a magnetic field guide. A first example embodiment of this is presented in FIG. 13A.

Similarly to the embodiments presented above, the quantum device can have a circuit element which is supported by a wafer. In this specific embodiment, the circuit element is a superconducting loop provided in the form of traces of a material exhibiting superconductivity during operation of the device and which are supported on a first surface of a wafer. More specifically, the wafer can have a first surface which supports the circuit element and a second surface which is opposite the first surface—the circuit element is "on chip".

Figure 13A:
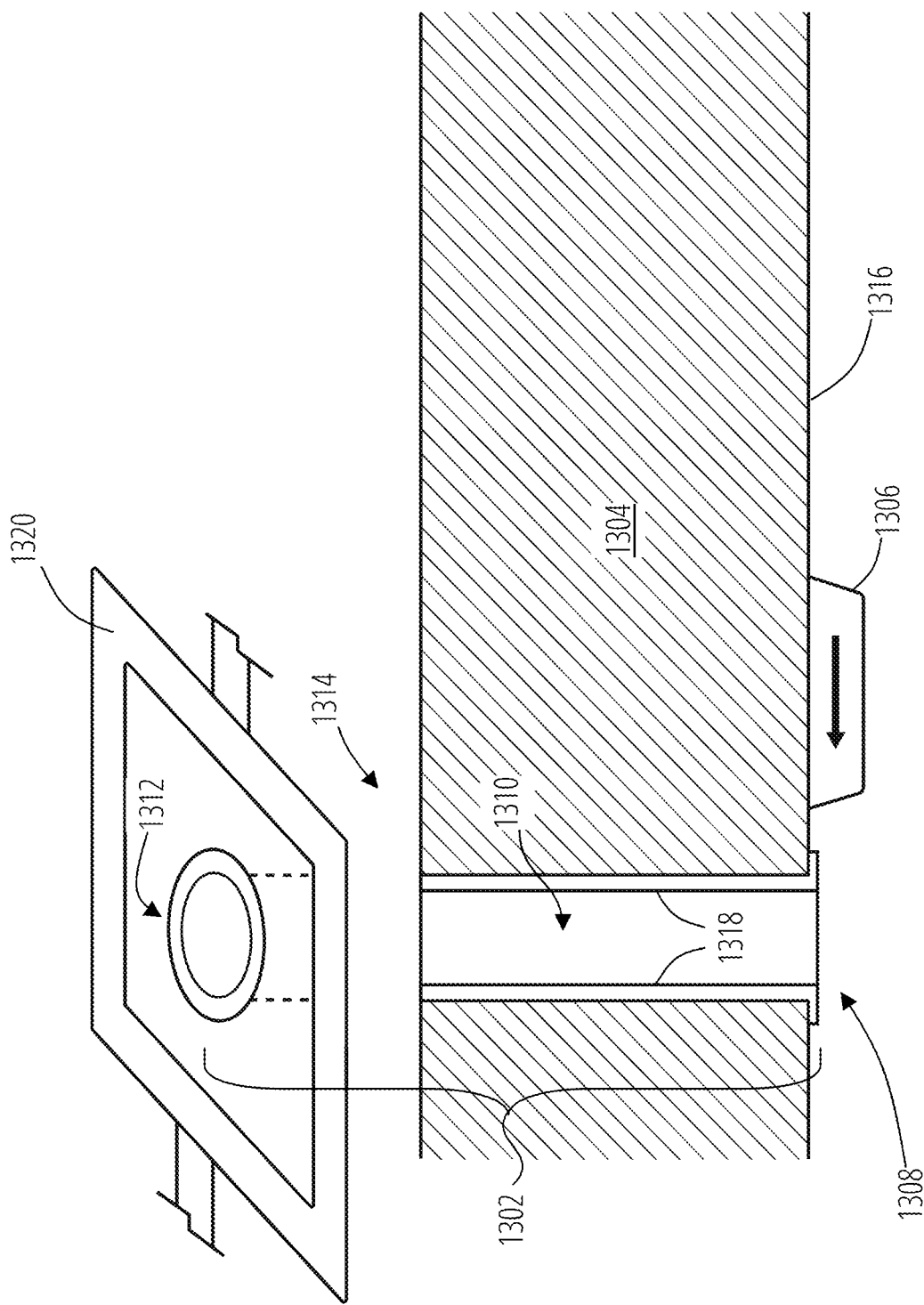
FIGS. 13A and 13B are schematic views of additional out-of-plane geometries.

In the embodiment presented in FIG. 13A, a magnetic field guide 1302 is provided. More specifically, a tubular passage 1310 extends across the wafer 1304, from a first end 1312 open through the first surface 1314, on the first side, to a second end 1308 open through a second surface 1316, on the second side. The magnetic field guide 1302 has a layer of material exhibiting superconductivity during operation of the quantum device (e.g. at very low temperatures inside a dilution refrigerator) which, in this embodiment, entirely coats the inner surface 1318 of the tubular passage 1310, inside the wafer 1304. The magnetic field guide 1302 is used here to guide the magnetic field across the wafer 1304, i.e. from the second side to the first side, when the guide layer is superconductive, during operation of the quantum device.

Figure 14:
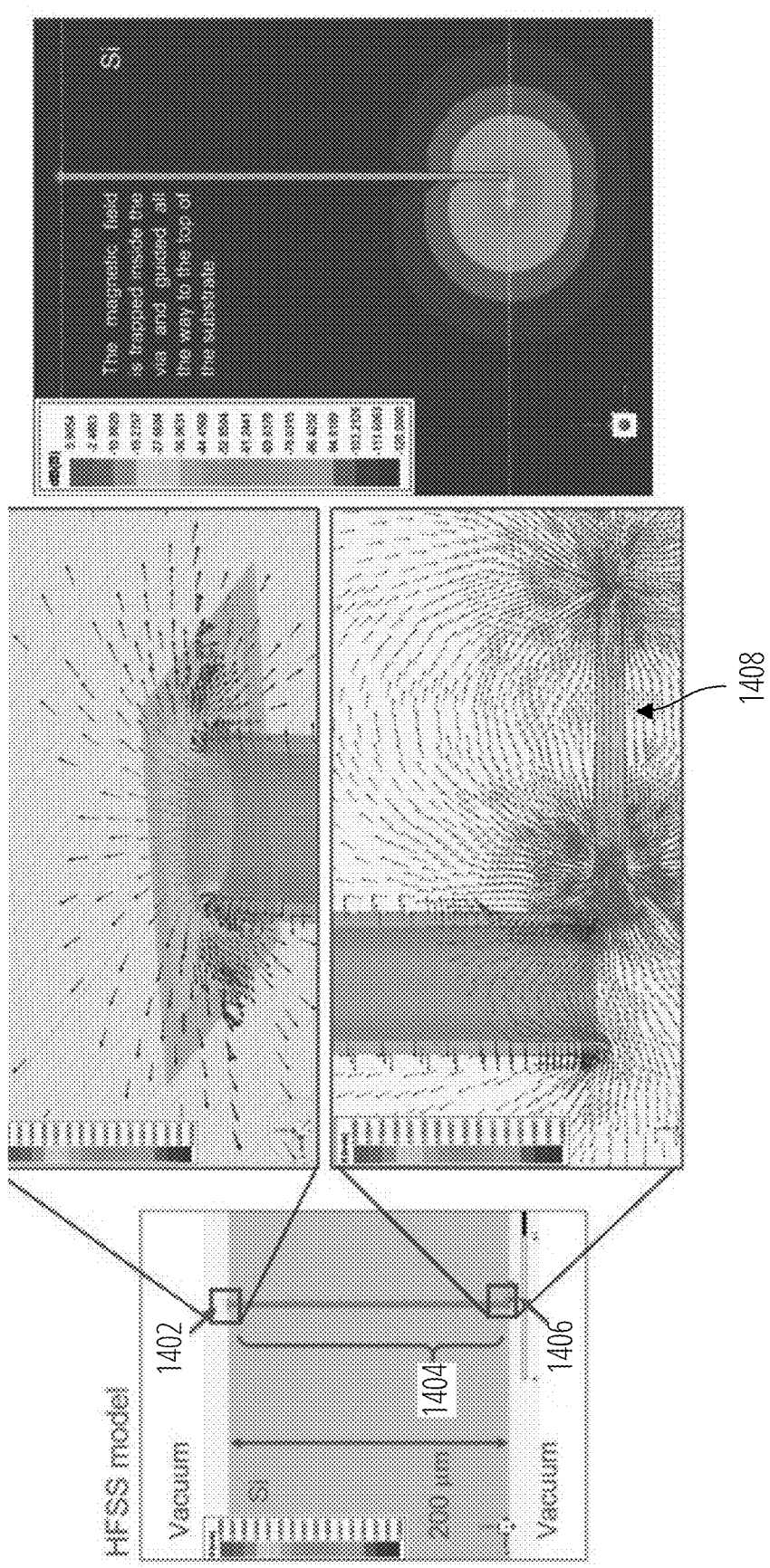
FIG. 14 is a graphical representation of simulation results showing the guiding of a magnetic field across a substrate and to a superconducting circuit element across a via.

In this first example, the magnetic field source is a bar magnet 1306 (elongated rectangular parallelepiped with field orientation aligned with length) which is positioned adjacent the second end 1308 of the via 1310, on the second surface 1316, i.e. the side of the wafer opposite the circuit element 1320, with its magnetic field orientation directed towards the magnetic field guide, and slightly offset from the wafer surface, which coincides here with the second end of the magnetic field guide. An HFSS simulation was conducted using a model presented on the left hand side of FIG. 14, and the middle and right-hand side of FIG. 14 present the results. For example, the flux loops at each end 1402 and 1406 of the via 1404. Also shown on the left-hand side of FIG. 14 is the location of the micromagnet 1408. The wafer had finite dimensions allowing the flux line to close back upon themselves around the wafer. Interestingly, the magnetic field can be seen to be trapped inside the magnetic field guide and guided all the way to the other end of the magnetic field guide by the magnetic field guide, whereas the magnetic field adjacent the magnetic field guide decreases in strength in an inverse polynomial manner. The portion of the magnetic field which is guided by the via can extend in a manner to impart a suitable magnetic flux across a superconducting loop or other superconducting circuit element, for instance.

Figure 13B:
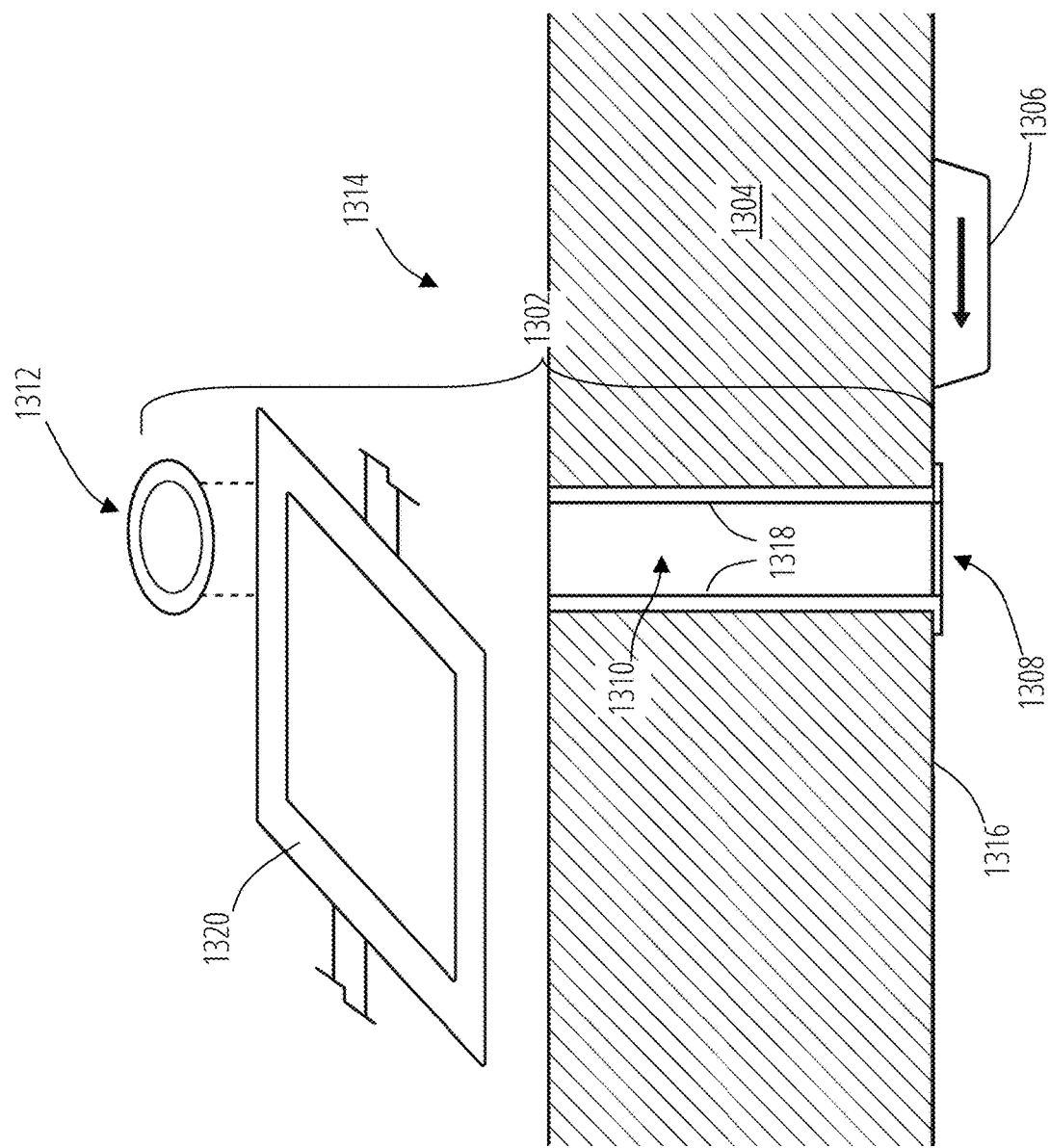

A feasibility analysis for a bar magnet having t=0.5 μm, w=1 μm, l=10 μm and a via radius of 2 μm yields $$\frac{\Phi}{\Phi_0} = 0.295 \text{ and } \frac{\max(|\vec{B}|_{flux\ loop})}{H_c} \approx 0.0003 < 0.1,$$

which meets the feasibility targets of the case study presented above. A similar case study where the aperture of the via 1312 is positioned adjacent the superconducting loop 1320 as presented in FIG. 13B, yields $$\frac{\Phi}{\Phi_0} = 0.238 \text{ and } \frac{\max(|\vec{B}|_{flux\ loop})}{H_c} \approx 0.0003 < 0.1,$$

again meeting the feasibility targets of the case study presented above.

Figure 15:
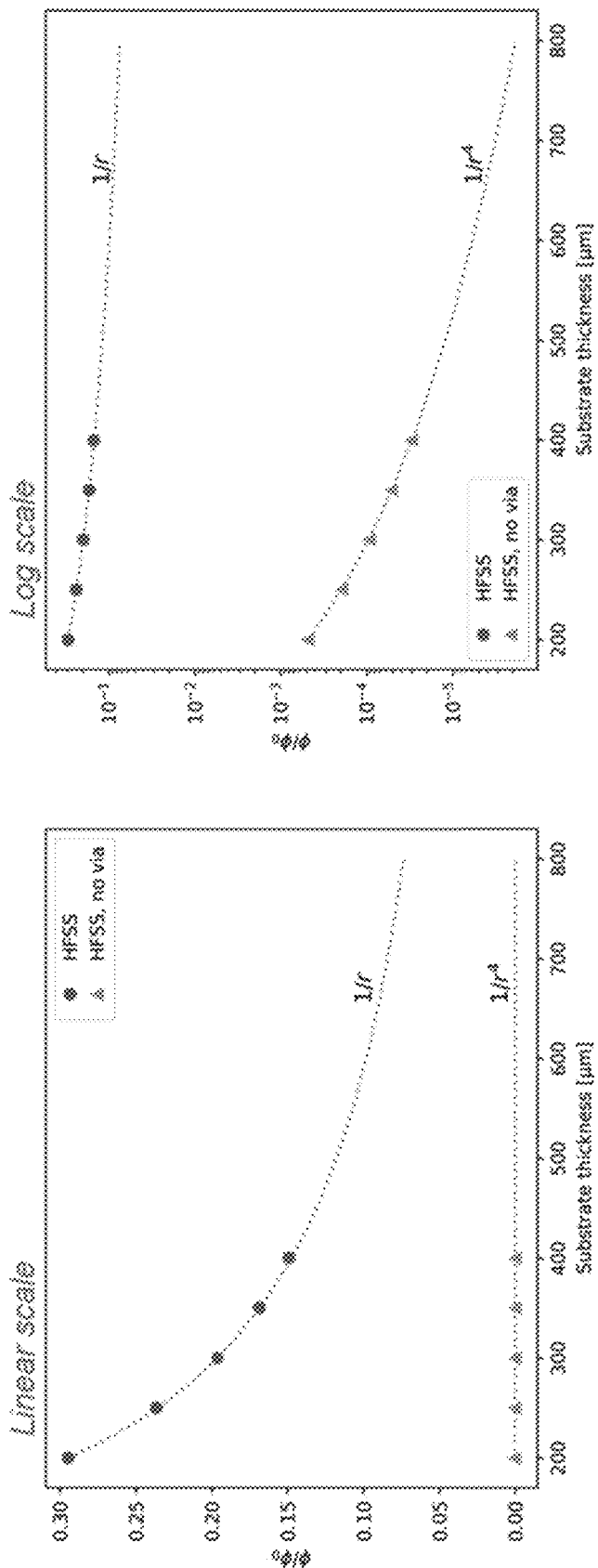
FIG. 15 is a graphical representation of the relationship between magnetic flux and substrate thickness/via length in a simulation such as presented in FIG. 14.

As seen in FIG. 15, while the relative magnetic flux generally decreases at a plural power of r (e.g. $1/r^4$—as would be expected from the configuration and magnetic dipole equations), using a via allows to change this relationship and the relative magnetic flux can then vary inversely proportional to r (e.g. 1/r), or otherwise vary inversely proportional to r at a power below 2 and even below 1.5. The relationship for a magnetic field guide having an aperture positioned outside the superconducting circuit loop is similar.

Figure 16:
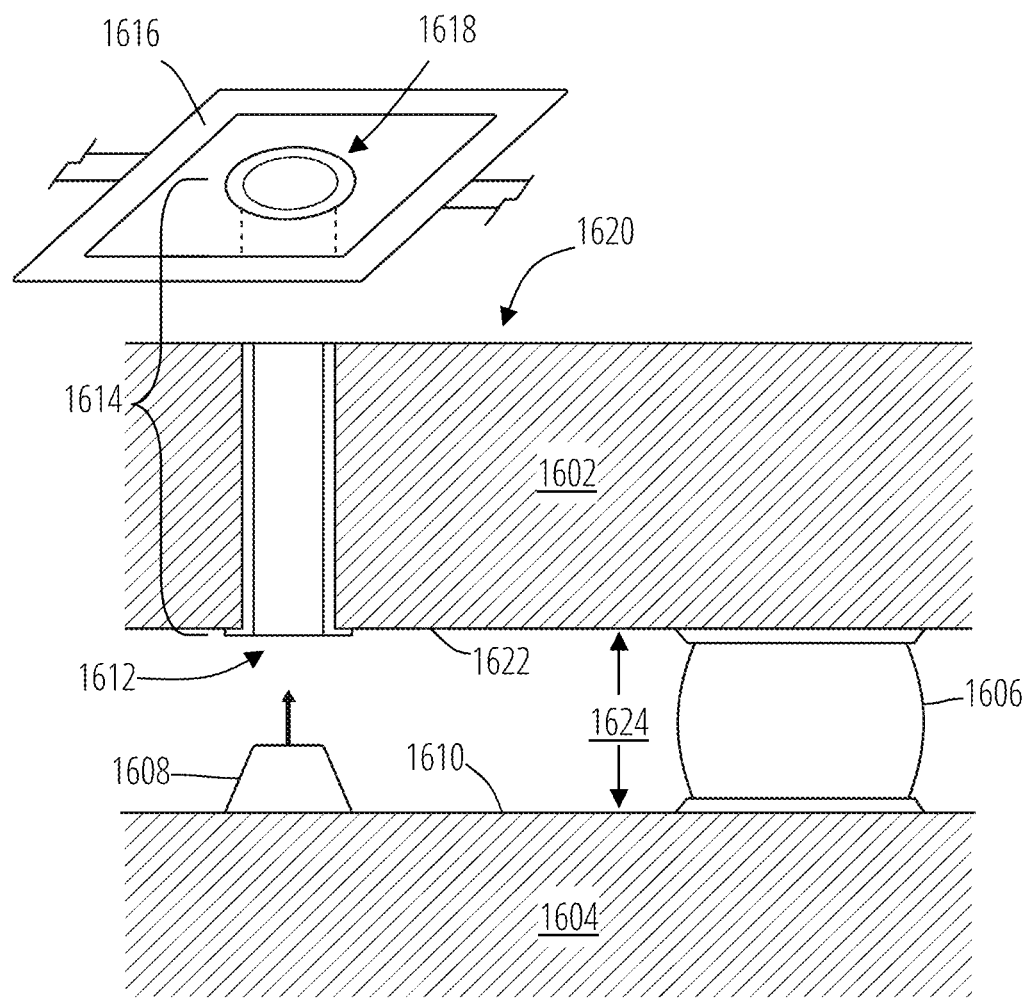
FIG. 16 is a schematic view of an additional out-of-plane geometry.
Figure 17:
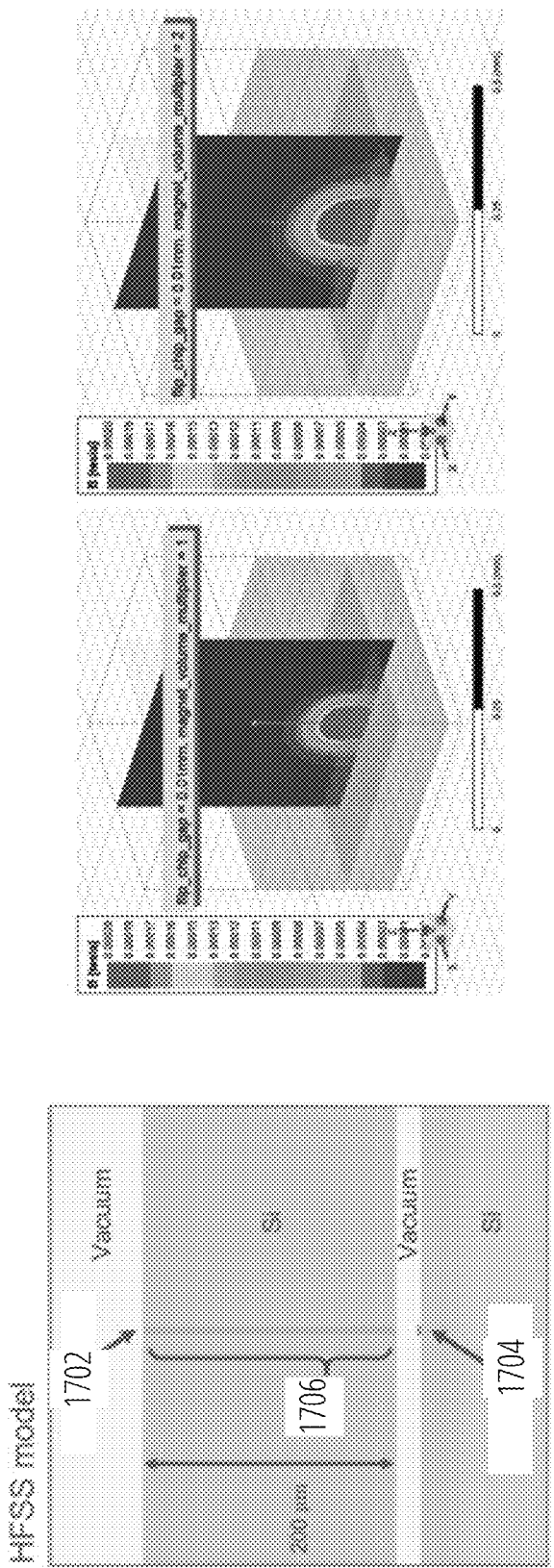
FIG. 17 is a graphical representation of simulation results showing the magnetic field stemming from a configuration such as presented in FIG. 16.

In a second example, schematized in FIG. 16 the magnetic field source is a dot magnet 1608 (cylindrical/truncated conical geometry with field orientation aligned with axis). The superconducting loop 1616 is supported by a first face 1620 of a first substrate or wafer 1602 (here a silicon wafer), and a (superconducting) magnetic field guide 1614 is defined across the first wafer 1602 from a first end 1618 proximate the superconducting loop 1616 to a second end 1612 at the opposite surface 1622 of the first wafer 1602. A second wafer 1604, such as another silicon wafer, is positioned adjacent the first wafer 1602, but held spaced apart therefrom by a given gap by a spacer element such as a solder ball bump 1606 or the like. The dot magnet 1608 is positioned of the surface 1610 of the second wafer 1604 which is adjacent the second end 1612 of the magnetic field guide, in alignment with the length of the magnetic field guide 1614, in a configuration which can be referred to as "flip chip". Moreover, the gap or distance 1624 between the surfaces 1610 and 1622 is also referred to as the "flip chip gap". FIG. 17 presents the details of the HFSS model (left) and HFSS simulation results are presented in the middle and right hand side (flip chip gap of 0.01 mm, and magnet volume multiplier of 1 and 2 respectively). Shown in FIG. 17, on the left-hand side, are the flux loop 1702, the micromagnet 1704, the via (or magnetic field guide) 1706.

Figure 18:
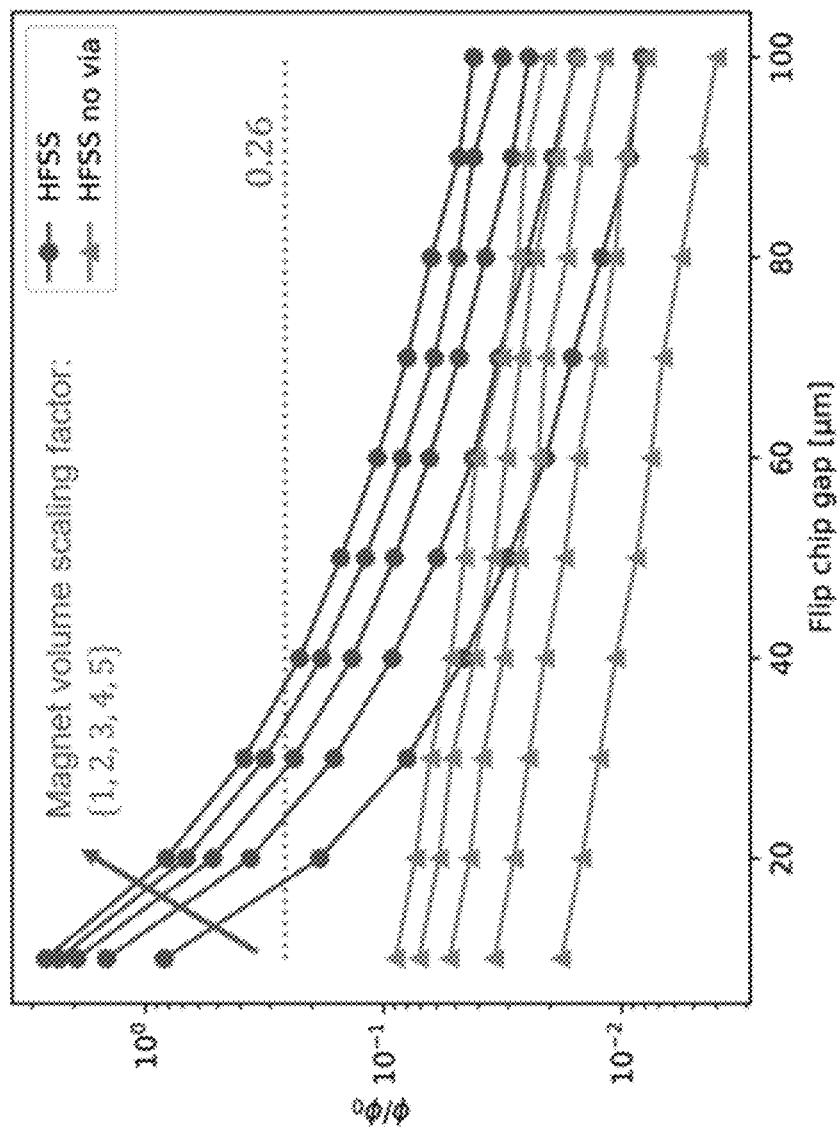
FIG. 18 is a graphical representation of a relationship between magnetic flux and flip chip gap and further of magnet volume scaling factor.

The relationship between the relative magnetic flux, the flip chip gap, and the magnet volume scaling factor (with initial magnet volume of 4.69 $um^3$), is presented in FIG. 18 in a manner to compare a with via and without via scenarios.

Figure 19:
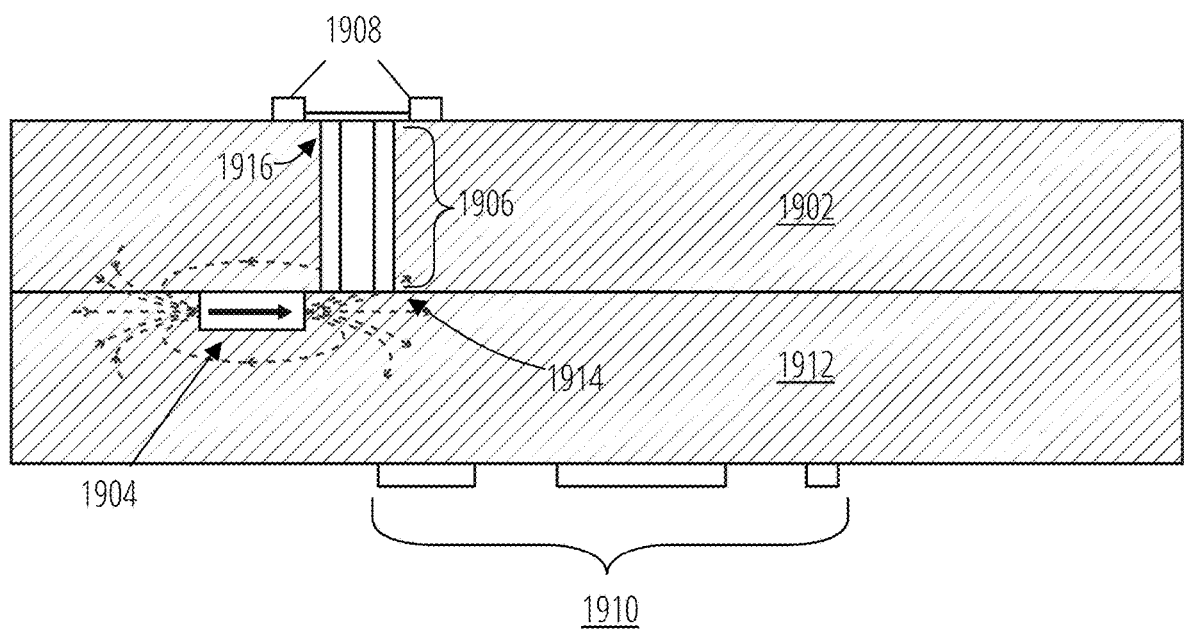
FIG. 19 is a schematic representation of another possible embodiment of a magnetic field guide.

Various alternate embodiments are possible. For instance, FIG. 19 presents yet another possible embodiment where the wafer has more than one wafer layer, and more specifically here two wafer layers (e.g., layers 1902 and 1912). The tubular passage of the magnetic field guide 1906 is blind, in the sense that it only extends across the first wafer layer 1902. Yet, a magnetic field source, provided here in the form of a micromagnet 1904, can be positioned between the two wafer layers, adjacent the second end 1914 of the magnetic field guide 1906, with a circuit element 1908 positioned adjacent the first end 1916, and the magnetic field guide 1906 can be used to guide the magnetic field to the quantum device circuit element 1908 during superconductivity. Also shown in FIG. 19 are other circuit elements 1910.

Figure 20:
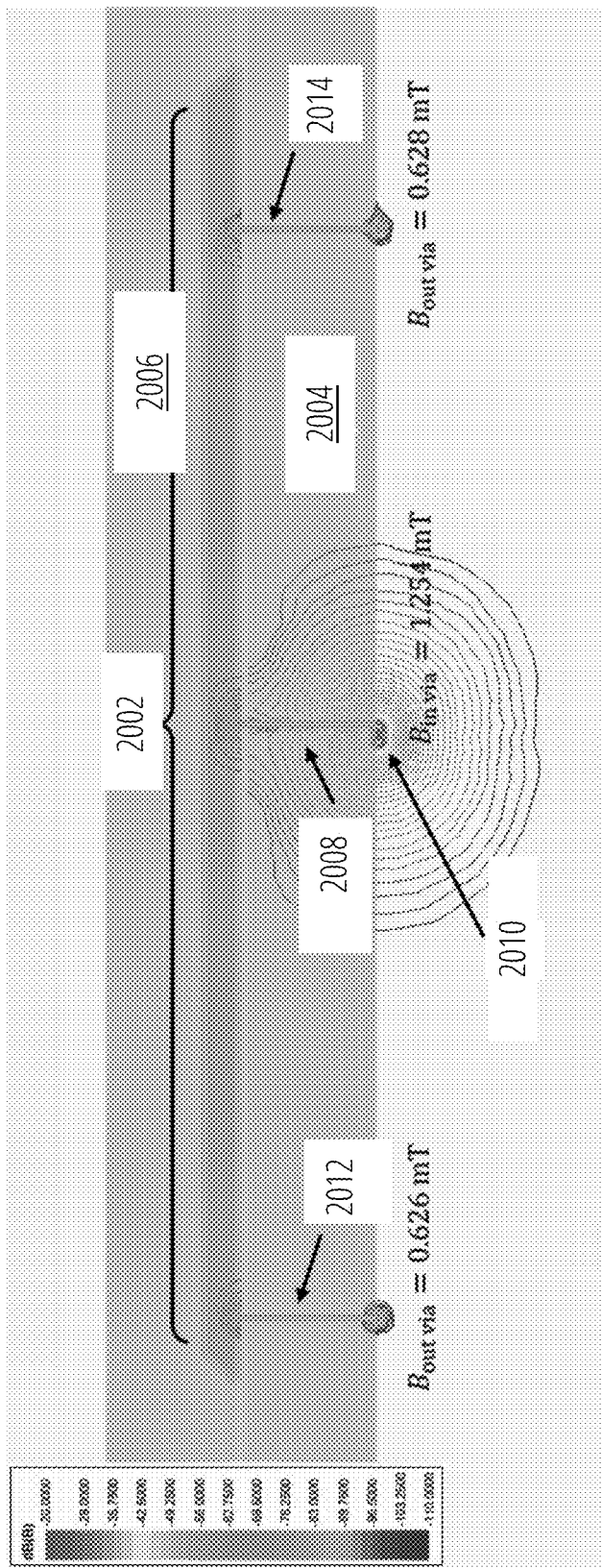
FIG. 20 graphically represents the results of a simulation performed for a quantum device configuration having superconducting magnetic guides and a superconducting cavity.

In some embodiments, for the magnetic field guide to be satisfactorily effective, the capability of the magnetic flux lines to close back upon themselves after having penetrated through the magnetic field guide should be provided for. Indeed, if the end of the magnetic field guide opens to a closed superconducting cavity, there will be no way back for the magnetic field and it may not penetrate the closed superconducting cavity across the magnetic field guide. Providing the magnetic field guide across a wafer of finite dimensions can be satisfactory to allow the magnetic field to close back upon itself around the edges of the wafer in some embodiments. In other embodiments, one or more "return" magnetic guides can be introduced across the wafer to promote the closing back of the magnetic field across the return magnetic guides. One particular embodiment is presented in FIG. 20. In the embodiment presented in FIG. 20, a cavity 2002 is formed between two wafer layers 2004 and 2006, and the surfaces of the cavity 2002 are entirely coated with a layer of superconducting material. One magnetic guide, which can be referred to here as a source guide 2008, is provided to guide the magnetic field of a magnetic field source (micromagnet 2010) into the cavity, and two return magnetic guides, which can be referred to as sink guides 2012 and 2014 here, are used to provide return passages from the superconducting cavity 2002. Interestingly, in such a configuration, such as shown in the illustrated simulation results, the magnetic field can be guided to many sink magnetic guides (e.g., sink guides 2012 and 2014) located at various distances from the source guide 2008 by the superconducting cavity 2002, without detectable or significant magnetic losses. Alternate configurations can use one or more than two sink magnetic guides, or more than one source magnetic guides, for instance. The magnetic field can be equally separated between the sink guides even if the distance with the source guide is not the same. Each sink guide can receive a same magnetic field maximum amplitude and the flux can depend on the area of the tubular passages. The union can perhaps be visualized with the source guide being a current source, the current being the magnetic flux inside the source guide, and the sink guides being resistive loads with impedance proportional to the area of the tubular passages within the superconducting coatings, in which case the Ohm law can be seen to be respected similarly as to how it is respected with electrical circuits.

Figure 21:
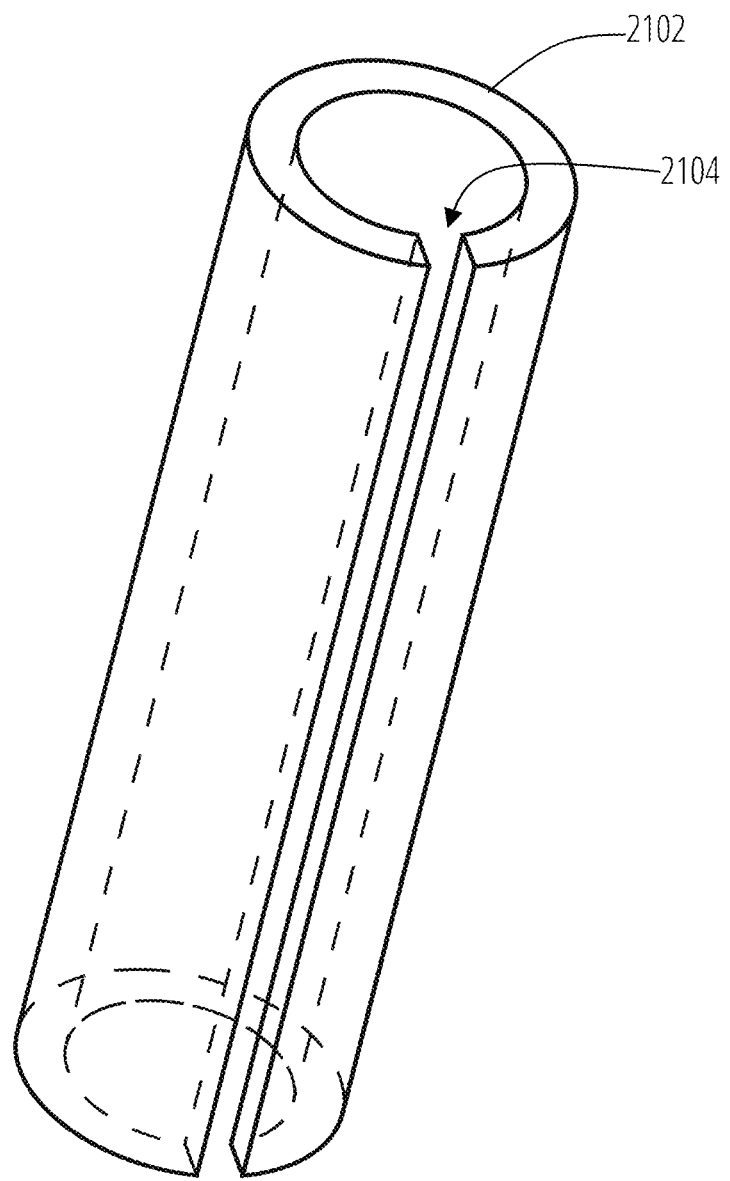
FIG. 21 is a schematic view of an example alternate configuration for a tubular element of a superconducting magnetic field guide.

In some embodiments, it can be preferred for the guide layer of the magnetic field guide to entirely cover the inner surface of the tubular passage. In other embodiments, such as the one presented schematically in FIG. 21, it can be preferred for the guide layer 2102 of the magnetic guide to cover most, but not all of the inner surface of the tubular passage. In the illustrated example, in particular, a relatively thin gap 2104, such as less than 15% of the diameter of the tubular passage, was left along the entire length of the guide layer, shown here alone for ease of understanding. Indeed, in some embodiments, the presence of such a gap may assist the functionality of the magnetic field guide, and in particular facilitate the penetration of the magnetic field in the transition between the non-superconducting state of the guide layer and the superconducting state of the guide layer. This can be particularly helpful in some embodiments where the circuit element receiving the magnetic field is a superconducting loop, and where the superconducting loop may resist a change of flux traversing it during the passage from the non-superconducting state to the superconducting state, and where the presence of the gap may help accommodate the transition. In some embodiments, this structure may be realized, in a non-limiting example, with an angle evaporation technique where the deposition is directional, for example e-beam evaporation. By slowly rotating the sample by less than 360° while evaporating at an angle, the inner portion of the via can be covered with the superconducting material while leaving the desire gap across the length of the via. In some embodiments, a variation of the same technique may be to use a suspended mask through shadow evaporation (also known as the Dolan technique or angular evaporation).

Figure 22B:
FIG. 22B is a schematic representation of a magnetic texture profile which can be achieved with a magnetic field guide distribution and associated magnetic field sources.
Figure 22B:
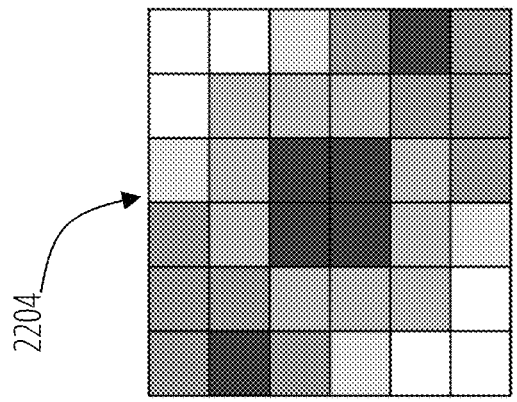
Figure 22A:
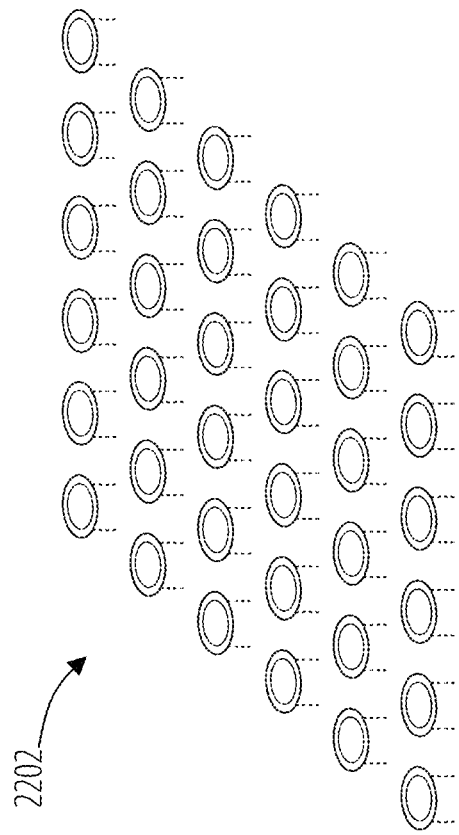
FIG. 22A is a schematic view of a magnetic field guide distribution along a wafer surface.
Figure 22C:
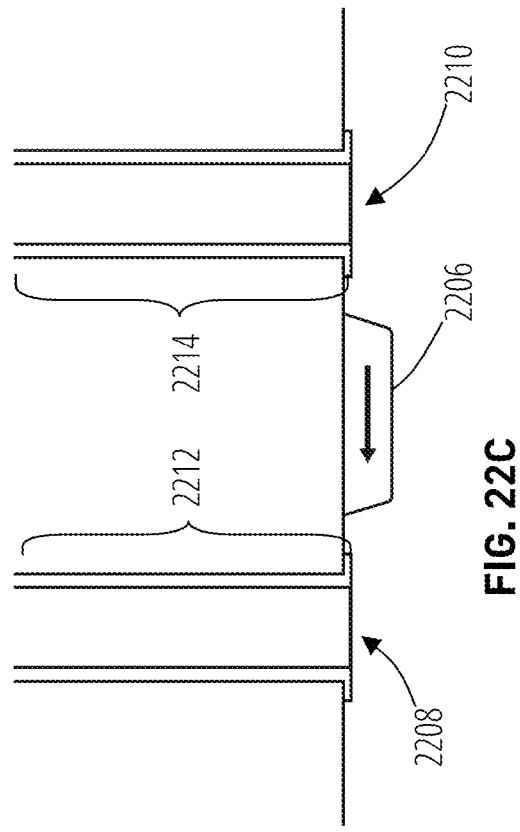
FIG. 22C is an example embodiment where a single magnet is used with two magnetic guides to generate oppositely polarized magnetic fields on the other side of the wafer.

Various configurations are possible. For instance, magnetic field guides with an associated active or passive magnetic field source on the other side of the supporting wafer can be used in lieu of micromagnets in an embodiment such as presented in FIG. 11C, to share a magnetic field to two or more circuit elements of a quantum device. Moreover, a plurality of magnetic field guides 2202 can be arrayed such as presented in FIG. 22A, and used to generate a magnetic texture profile 2204 along a given wafer surface such as presented in FIG. 22B, wherein $|\vec{B}_\perp|$ is the magnetic field perpendicular to the top substrate. It will be understood that such a magnetic texture profile can include not only one flux polarity, but two opposite flux polarities, by using a transversally oriented magnetic field source 2206 between the opposite ends 2208 and 2210 of two magnetic guides 2212 and 2214, respectively, such as presented in FIG. 22C. In such embodiments, the intensity of the field exiting the given wafer surface can be gauged not only by the strength of the associated magnetic field source(s), but also by the distance between the opposite end of the magnetic field guide and the associated magnetic field source(s).

While magnets were used as the magnetic field source in the embodiments presented in FIGS. 13A and 16, it will be understood that replacing the permanent magnets with comparable flux bias lines with proper geometry would be expected to generate similar results, and active magnetic field sources can be a suitable alternative to passive magnetic field sources in some embodiments.

In both the embodiments of FIG. 13A and FIG. 16, the superconducting circuit is positioned proximate the first end, and the magnetic field source is positioned proximate the second end.

Interestingly, when the magnets are located entirely outside of the wafer surface (e.g. plane) of a superconducting loop, such as is the case in the examples presented in FIGS. 13A and 16, and convey their magnetic field through a magnetic field guide, the magnets may cause no, or significantly lower losses due to conduction. Accordingly, the losses can be expected to be significantly smaller than for the simulated cases with "front plane" magnets presented above.

There may be embodiments where a magnetic field guide and its associated magnetic field source may be used as a magnetic field source for other quantum device circuit elements than superconducting loops, such as Josephson junctions such as presented in FIG. 1E, or spin qubits such as presented in FIG. 1G.

In one embodiment, the volume within the guide layer can be left empty, whereas in another embodiment, the volume can be filled with a non-conducting material, for instance.

While some examples presented above and illustrated present magnetic field guides used to guide the magnetic field emitted by permanent magnets, it will be understood that comparable magnetic fields emitted by flux bias lines or the like can be expected to be guided by vias in a similar manner, and therefore, magnetic field guides can be used to guide the magnetic field of passive or active magnetic field sources, and therefore to guide passive or active magnetic fields in various embodiments. A flux bias line can be provided in the form of a superconducting element in a given configuration/shape, connected to an electrical drive. Positioning an electromagnet remotely and guiding its magnetic field with a via may allow reducing cross-talk between the magnetic field generating circuit and the superconducting circuit (e.g. qubit-hosting) of the quantum device compared to a scenario where the flux bias lined is positioned adjacent a superconducting loop, within the virtual surface of the superconducting loop, or otherwise closer to the superconducting loop. In particular, for instance, positioning the end of the via outside the superconducting loop may allow to reduce any losses experienced by the superconducting circuit and/or sharing the magnetic field conveyed by the magnetic flux line to more than one superconducting loop, for instance.

Potential Applications

Quantum devices which make use of magnetic fields, and which may benefit from the use of one or more permanent magnet, one or more magnetic field guide to convey a magnetic field across a wafer, or both, can be used in a wide variety of applications. An example one of such applications is a quantum computer, in which superconducting circuits may be useful in implementing qubits or couplers. A typical quantum computer architecture is presented in FIG. 23.

Indeed, the operations to be performed on qubits depend to a certain extent on the choice of architecture of the full processor. There are a number of competing architectures. Example embodiments for two of these will be provided below: quantum annealers and gate-based quantum processors.

Figure 23:
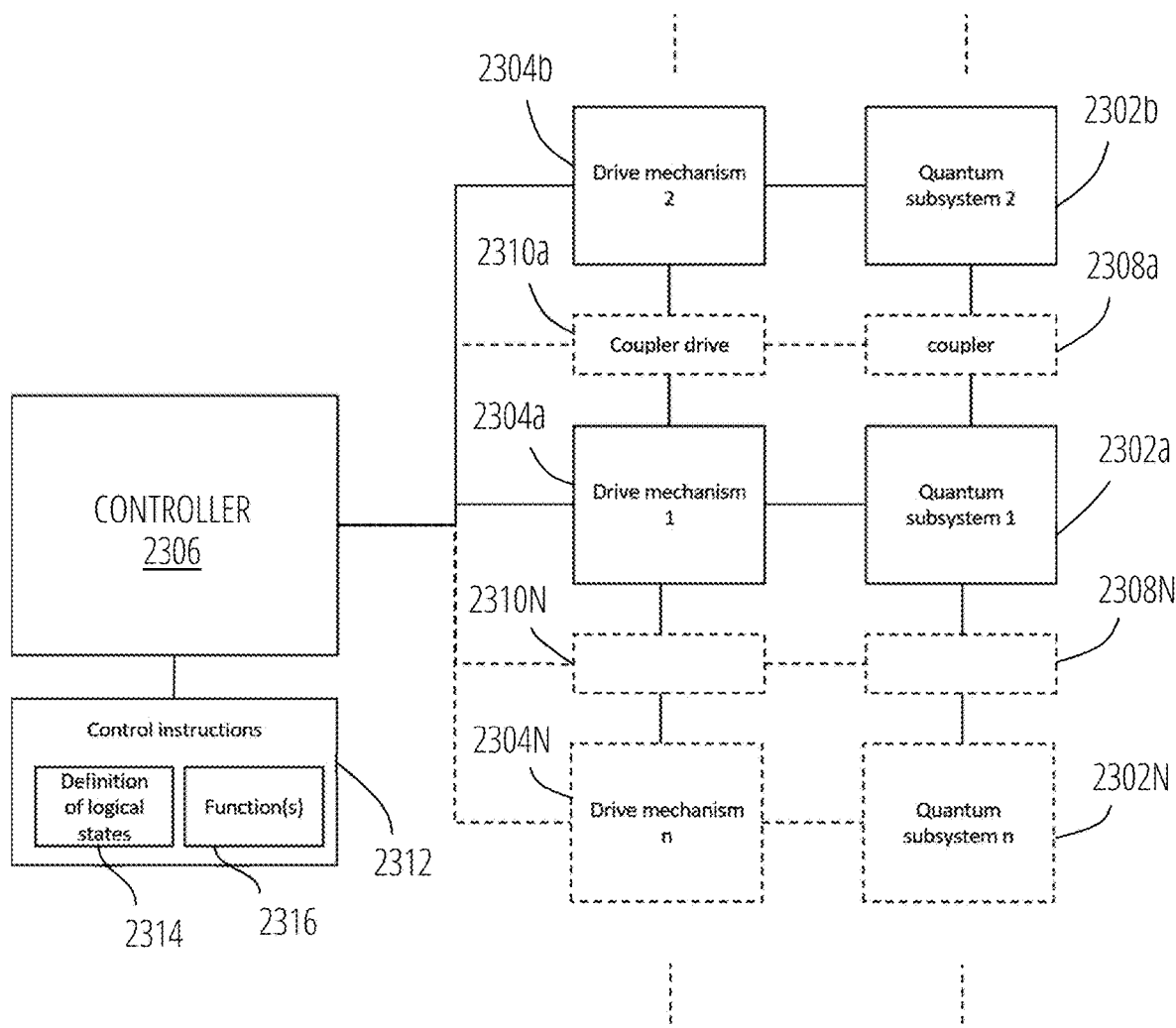
FIG. 23 is a schematic view of a quantum system which can be implemented as a quantum processor, including a plurality of quantum devices forming quantum subsystems which can host qubits.

Depending on the type of architecture, and also the type of quantum subsystem used as the basis for the logical states, the details of implementation of a quantum processor can vary greatly from one embodiment to another. However, in general, many architectures and types will involve the use of two or more quantum subsystems to carry the quantum computation. Indeed, as shown in FIG. 23, a typical example quantum processor will require at least two quantum subsystems (e.g., 2302a, 2302b, . . . 2302N) which will be interconnected for their quantum states to interact with one another in an interaction which will typically involve entanglement. The type of quantum subsystem will vary depending on the architecture. Most quantum systems embodied as bosonic-based quantum processors involve some form of resonator to host quantum states, and the quantum states will be driven in the quantum subsystems using some form of driving hardware (e.g., 2304a, 2304b, . . . , 2304N) which can control a number of bosons in the quantum subsystems. The driving hardware is controlled by a component which will be referred to herein as a controller 2306, and which is typically provided in the form of a classical computer. The quantum subsystems are typically refrigerated to very low temperatures and insulated from the environment. In some architectures, such as a quantum annealing type architecture, or a measurement based quantum computing architecture, the quantum subsystems can be directly operably interconnected to one another. In some architectures, such as gate-based quantum computing, the quantum subsystems are typically interconnected to one another via couplers (e.g., 2308a . . . 2308N) which are used to selectively control the interaction between the quantum subsystems. The couplers 2308a, . . . , 2308N, are also quantum subsystems operable to host states by which the quantum states of the two or more connecting quantum subsystems are to interact, and are also driven by driving hardware (e.g., coupler drives 2310a, . . . , 2310N) which can be controlled by the same controller 2306 for convenience. Also shown in FIG. 23 is the controller 2306 being operationally coupled to control instructions 2316 stored for example in a non-volatile memory of said classical computer (not shown). In some embodiments, the controller 2306 is configured to execute the control instructions 2316, which include a definition of logical states 2314 to be generated in the quantum subsystems 2302a, . . . , 2302N, and one or more functions 1316 to operate the driving hardware 2304a, 2304b, . . . , 2304N and coupler drives 2310a, . . . 2310N to do so.

The skilled person in the art will appreciate that materials exhibiting superconductivity, used for example for the guide layers discussed above, may include, without limitation, materials such as Niobium (Nb), Niobium Nitride (NbN) Niobium Titanium Nitride (NbTiN) Tantalum (Ta) Tantalum Nitride (TaN), and Aluminum (Al). Similarly, the superconducting material used to manufacture Josephson junctions is typically Al. However, the present disclosure doesn't exclude other superconducting materials from being used in the Josephson junctions, as will be readily understood by the person skilled in the art.

In some embodiments, the magnetic field guides may be oriented at an angle with respect to one or more substrate surfaces, and/or may comprise curved portions. In some embodiments, two or more magnetic field guides or vias may be directly coupled to one another to guide the portion of the magnetic field.

While the present disclosure describes various embodiments for illustrative purposes, such description is not intended to be limited to such embodiments. On the contrary, the applicant's teachings described and illustrated herein encompass various alternatives, modifications, and equivalents, without departing from the embodiments, the general scope of which is defined in the appended claims. Information as herein shown and described in detail is fully capable of attaining the above-described object of the present disclosure, the presently preferred embodiment of the present disclosure, and is, thus, representative of the subject matter which is broadly contemplated by the present disclosure.

What is claimed is:

1. A quantum device comprising:
a substrate;
a superconducting circuit element supported on a substrate surface of said substrate, the superconducting circuit element exhibiting superconductivity during operation of the quantum device;
a passive magnetic element, the passive magnetic element generating a magnetic field, the superconducting circuit element being directly or indirectly exposed to at least a portion of the magnetic field during operation of the quantum device; and
wherein the superconducting circuit element comprises a superconducting loop having two branches splitting and recombining at corresponding points, each branch having at least one Josephson junction, wherein said portion of the magnetic field contributing a magnetic flux across the superconducting loop;
wherein the passive magnetic element and the superconducting circuit element are both supported by said substrate surface of said substrate;
wherein the passive magnetic element is positioned adjacent the superconducting circuit element; and
wherein the superconducting loop comprises at least one low sensitivity axis, and wherein the passive magnetic element is positioned on said low sensitivity axis.

2. The quantum device of claim 1, wherein said low sensitivity axis extends transversally across the two branches of said superconducting loop.

3. The quantum device of claim 1, wherein the passive magnetic element has a magnetization direction perpendicular to said substrate surface.

4. The quantum device of claim 3, wherein said passive magnetic element is a first passive magnetic element, further comprising a second passive magnetic element supported by the substrate surface, the second passive magnetic element positioned centrally relative to the superconducting loop.

5. The quantum device of claim 4, further comprising a third passive magnetic element supported by the substrate surface, the third passive magnetic element positioned adjacent to the superconducting loop opposite the first passive magnetic element.

6. The quantum device of claim 1, wherein the passive magnetic element has a magnetization direction parallel to said substrate surface, and the magnetization direction is oriented along said low sensitivity axis of the superconducting loop.

7. The quantum device of claim 1, wherein the passive magnetic element is located above or below a plane defined by said superconducting loop.

8. The quantum device of claim 7, wherein said passive magnetic element is located in a depression formed in said substrate surface.

9. The quantum device of claim 1, wherein the superconducting circuit element is selected from the group consisting of: a flux qubit, a superconducting quantum interference device (SQUID), a superconducting nonlinear asymmetric inductive element (SNAIL), and a capacitively shunted SNAIL (SNAILMON).

10. The quantum device of claim 1, wherein said superconducting element is one of a plurality of superconducting elements, the plurality of superconducting elements arranged in an array configuration on the substrate surface.

11. The quantum device of claim 1, wherein the magnetic flux is in the order of magnitude of a magnetic flux quantum $\Phi_0$.

12. The quantum device of claim 1, wherein said superconducting circuit element is configured to operate as a quantum subsystem of a quantum computer and wherein the superconducting circuit element is operable to host therein at least one qubit during operation of the quantum computer.

\* \* \* \* \*